United States Patent [19]
Kamon

[11] Patent Number: 6,061,188
[45] Date of Patent: May 9, 2000

[54] PROJECTING PRINTING APPARATUS, PROJECTION PRINTING METHOD, MASK PATTERN FOR ESTIMATING AMPLITUDE ABERRATIONS, METHOD OF ESTIMATING THE QUANTITY OF AMPLITUDE ABERRATION, AND AMPLITUDE-ABERRATION ESTIMATING FILTER

[75] Inventor: Kazuya Kamon, Hyogo, Japan

[73] Assignee: Mitsubishi Denki Kabushiki Kaisha, Tokyo, Japan

[21] Appl. No.: 08/982,221

[22] Filed: Dec. 1, 1997

[30] Foreign Application Priority Data

Jun. 2, 1997 [JP] Japan ..................................... 9-144090

[51] Int. Cl.[7] .......................... G02B 17/00; G02B 27/14
[52] U.S. Cl. ......................... 359/727; 359/631; 359/730; 359/731
[58] Field of Search ..................................... 359/648, 649, 359/629, 631, 633, 727, 730, 731

[56] References Cited

U.S. PATENT DOCUMENTS

| | | | |
|---|---|---|---|
| 4,936,665 | 6/1990 | Whitney | 359/565 |
| 5,241,423 | 8/1993 | Chiu et al. | 359/727 |
| 5,251,070 | 10/1993 | Hashimoto et al. | 359/732 |
| 5,289,312 | 2/1994 | Hashimoto et al. | 359/727 |
| 5,362,585 | 11/1994 | Adams | 430/30 |
| 5,610,684 | 3/1997 | Shiraishi | 355/55 |
| 5,668,673 | 9/1997 | Suenaga et al. | 359/731 |
| 5,793,473 | 8/1998 | Koyama et al. | 359/629 |

FOREIGN PATENT DOCUMENTS

| | | |
|---|---|---|
| 57-048731 | 7/1982 | Japan. |
| 6-181162 | 6/1994 | Japan. |
| 6-181163 | 6/1994 | Japan. |
| 7-294819 | 11/1995 | Japan. |
| 8-54738 | 2/1996 | Japan. |
| 8-179216 | 7/1996 | Japan. |

*Primary Examiner*—Scott J. Sugarman
*Attorney, Agent, or Firm*—McDermott, Will & Emery

[57] ABSTRACT

In a projection printing apparatus, illumination light from a lamp housing illuminates a photomask, and a diffracted light beam from the photomask is focused on an exposed substrate via a projection optical system to project a circuit pattern, the projection optical system including first and second halfmirrors and first and second concave mirrors. The first and second halfmirrors are arranged in symmetry or similar symmetry with respect to a normal to an optical axis of a diffracted light beam directed from the first halfmirror to the second halfmirror. Thus, a projection printing apparatus and a projection printing method are obtained in which unevenness in transmissivity in the projection optical system can be compensated for and steric hindrance or degradation of image characteristics is not caused.

28 Claims, 24 Drawing Sheets

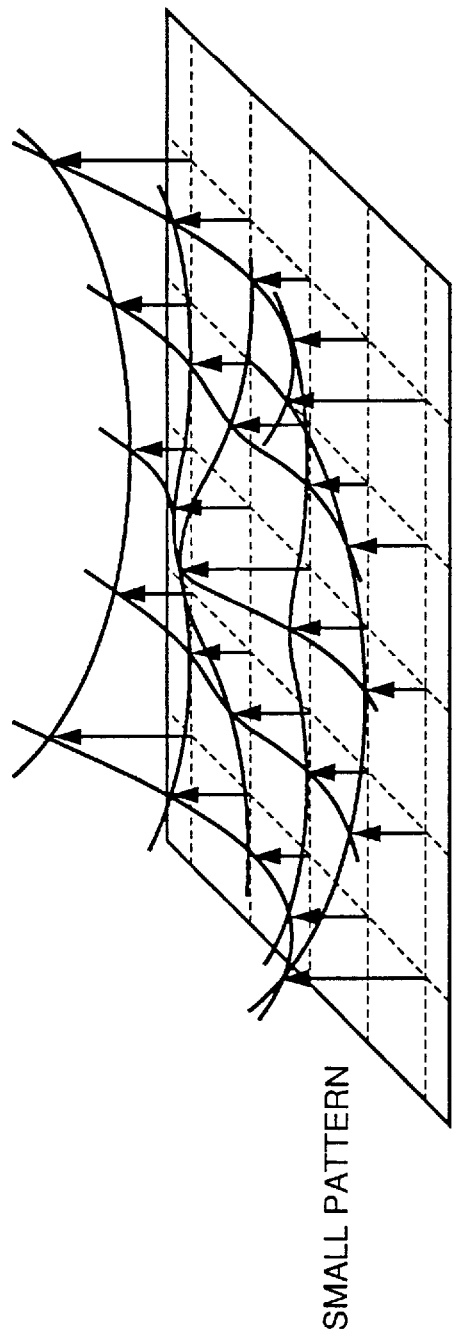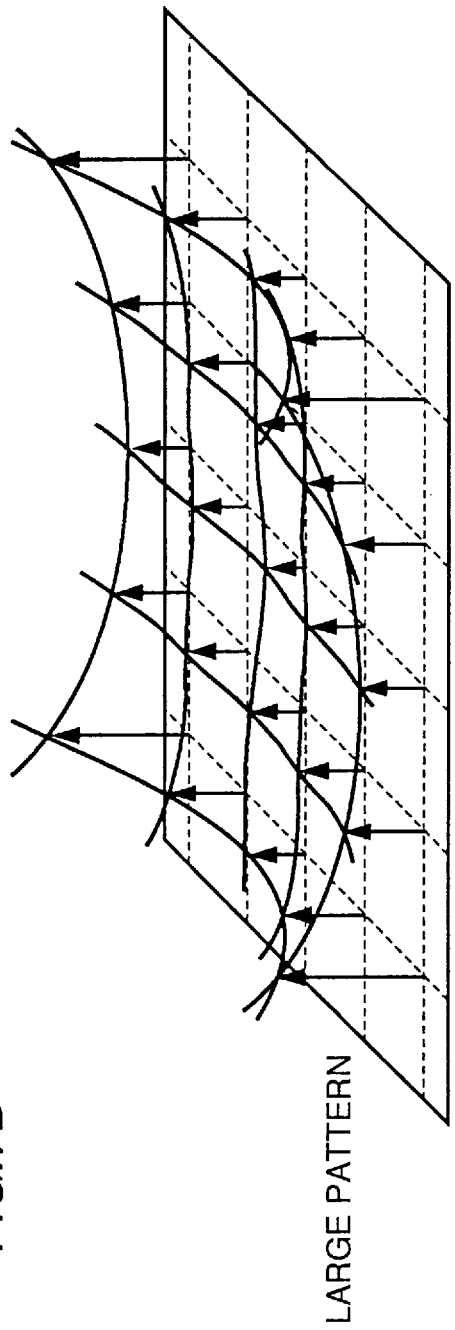
FIG.7A SMALL PATTERN
FIG.7B LARGE PATTERN

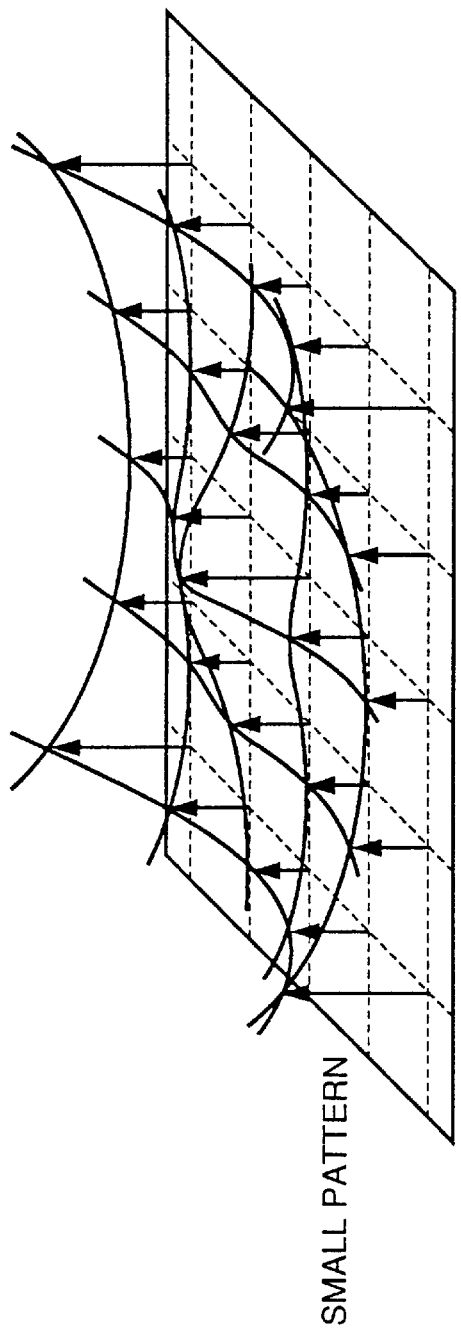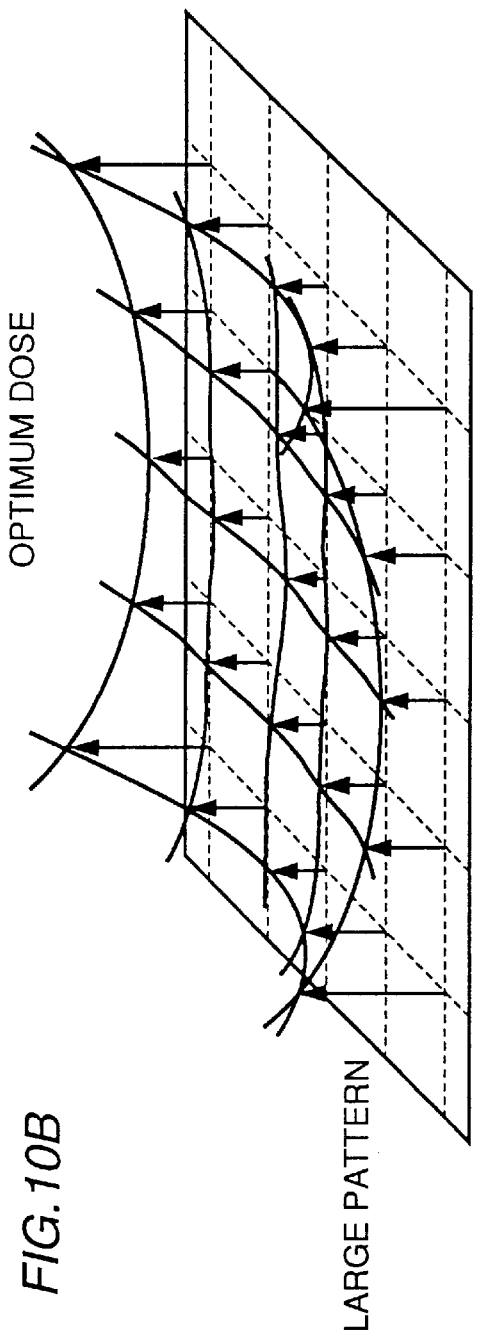

TRANSMITTANCE

PROJECTING PRINTING APPARATUS, PROJECTION PRINTING METHOD, MASK PATTERN FOR ESTIMATING AMPLITUDE ABERRATIONS, METHOD OF ESTIMATING THE QUANTITY OF AMPLITUDE ABERRATION, AND AMPLITUDE-ABERRATION ESTIMATING FILTER

BACKGROUND OF THE INVENTION

1. Field of the Invention

The present invention relates to a projection printing apparatus, a projection printing method, a mask pattern for evaluating amplitude aberration, a method of estimating the quantity of amplitude aberration and a filter for eliminating amplitude aberrations, used in LSI (Large Scale Integrated Circuit) manufacturing process.

2. Description of the Background Art

A conventional projection printing apparatus will now be described.

FIG. 22 is a schematic diagram showing a configuration of the conventional projection printing apparatus. In a projection printing apparatus 110, a fly-eye lens 13 is arranged in front of a lamp housing 11 with a mirror 12 interposed therebetween and an aperture 14 is positioned in front of fly-eye lens 13. A blind 16 is arranged in front of aperture 14 with a condenser lens 15 interposed therebetween and is followed by a condenser lens 17, a mirror 18, a condenser lens 19 and a photomask 20 having a desired circuit pattern formed thereon. A wafer 21 is arranged in front of photomask 20 with a projection optical system interposed therebetween.

Projection optical system 106 has a condenser lens 101, a pupil plane or pupilary surface 105 and a condenser lens 102 arranged in front of photomask.

Generally, the limit of resolution R in photolithography employing reduction-type projection printing is represented by the following equation:

$$R = k_1 \cdot \lambda/(NA)$$

wherein $\lambda$ represents the wavelength in nm of the light used, NA represents the numerical aperture of the lens used and $k_1$ represents a constant which depends on resist process.

As can be seen from the above equation, the limit of resolution R can be improved, or a micropattern can be obtained, by reducing the values of $k_1$ and $\lambda$ as well as increasing the value of NA, i.e., by reducing a constant which depends on resist process as well as reducing the wavelength of the light used and increasing the value of NA.

However, this method has its limitation, since when the wavelength is reduced and the value of NA is increased, the focal depth $\delta$ ($\delta = K_2 \cdot \lambda/(NA)^2$) of the light is reduced and thus resolution is degraded. Furthermore, the reduction of the wavelength of exposure light requires an extensive modification of transfer process. Particularly for a wavelength of exposure light of no more than 170 nm, prolonged ultraviolet irradiation causes point lattice defect, such as color center, in the material of the lens used. Since the generation of color center causes unevenness in transmissivity and refractive index of the lens and thus the lifetime of the lens system is substantially determined, it is increasingly difficult to obtain high resolution with optical systems employing lenses.

There has been an attempt to overcome this difficulty using mirror at a portion of projection optical systems. Such examples are described in detail, for example, in Japanese Patent Laying-Open Nos. 6-181162, 6-181163 and the like.

A projection optical system described in Japanese Patent Laying-Open No. 6-181162 will now be described. FIG. 23 is a schematic view of the projection optical system of the projection printing apparatus disclosed in Japanese Patent Laying-Open No. 6-181162. The projection printing apparatus has a first group of lenses 201 and 202 having a positive refractive index, a light beam splitter 203, a second group 204 of lenses having a negative refractive index, a concave mirror 205 and a third group 206 of lenses having a positive refractive index in front of a photomask 20.

In the projection printing apparatus, the diffracted light from photomask 20 is transmitted through the first group of lenses 201 and 202, light beam splitter 203 and the second group 204 of lenses and reflected from convex mirror 205. The diffracted light reflected from convex mirror 205 is again transmitted through the second group 204 of lenses, reflected from light beam splitter 203, transmitted through the third group 206 of lenses and thus forms an image on the exposed surface of a wafer 21.

While the aforementioned projection printing apparatus uses mirror at a portion of the projection optical system, it still uses many lenses 201, 202, 204 and 206. Thus, the projection printing apparatus cannot completely resolve unevenness in transmissivity associated with the degradation of the material of lens caused by the reduction of the wavelength of exposure light. Furthermore, when the wavelength of exposure light is no more than 170 nm, color center is also caused in a halfmirror, such as light beam splitter 203, as well as in the lens mentioned above, and thus the degradation of its material associated with the generation of color center will causes an uneven distribution of transmissivity (an unevenness in its transmissivity).

Meanwhile, an example wherein lenses are completely removed is found as an optical system described in Japanese Patent Laying-Open No. 8-54738. FIG. 24 is a schematic view of a configuration of the projection optical system of the projection printing apparatus disclosed in Japanese Patent Laying-Open No. 8-54738. The projection printing apparatus has an aperture 301, a convex mirror 302 and a concave mirror 303.

In this projection printing apparatus, the diffracted light from photomask 20 is transmitted through aperture 301 and then reflected from convex mirror 302 and then by concave mirror 303 and then forms an image on exposed substrate 21.

Since the projection printing apparatus does not use a lens, uneven transmissivity due to degradation of lens material is not caused. However, the light incident on convex mirror 302 from exactly above in the figure, such as zero-order diffracted light, is directly reflected and thus cannot illuminate exposed substrate 21, i.e., the so-called steric hindrance is disadvantageously caused.

Even if zero-order diffracted light beam should illuminate exposed substrate 21, the diffracted light beams on the right and left sides of the zero-order diffracted light beam behave differently and thus satisfactory image characteristics cannot be obtained. For example, assuming that zero-order diffracted light beam is reflected from convex mirror 302 and then by the right portion of concave mirror 303 in the figure and illuminates exposed substrate 21, when positive and negative, first-order diffracted light beams are reflected at the right and left portions of concave mirror 303 in the figure, respectively, illuminate exposed substrate 21, the angle of incidence of the positive and negative, first-order diffracted light beams are different from each other with respect to the zero-order diffracted light beam and thus satisfactory image characteristic cannot be obtained.

Furthermore, due to the behaviors of the diffracted light beams mentioned above, the conditions for imaging the longitudinal pattern of photomask 20 on exposed substrate 21 are different from those for imaging the lateral pattern of photomask 20 on exposed substrate 21 and thus satisfactory image characteristics of the longitudinal and lateral patterns cannot be obtained.

Furthermore, it is generally difficult to eliminate wavefront aberration in mirror systems and thus a portion having less wavefront aberration should be selected for use.

Typical aberrations are spherical aberration, astigmatism aberration, field curvature, distortion aberration and coma aberration. It is known that these aberrations can be expressed, as illustrated in FIGS. 25A–25E, respectively, by conversion into wavefront aberration on pupil surface, FIGS. 25A, 25B, 25C, 25D and 25E illustrating spherical aberration, astigmatism aberration, field curvature, distortion aberration and coma aberration, respectively. In the figures, $\phi$ represents the quantity in shift of a wavefront at a pupil plane; $\rho$ the radius on the pupil plane ($\eta\xi$ plane); $\theta$ the angle of rotation with respect to the $\eta$ axis; $y_0$ coordinates on a wafer surface; and B to F constants. The details of these aberrations are described, for example, in "Principle of Optics I–III" (published by Tokai University Press).

SUMMARY OF THE INVENTION

One object of the present invention contemplates a projection printing apparatus and a projection printing method wherein uneven distribution of transmissivity can be compensated for in a projection optical system and steric hindrance or the degradation of image characteristics is not caused.

Another object of the present invention contemplates an amplitude-aberration estimating mask pattern for estimating an amplitude aberration associated with an optical system, and a method of estimating the quantity of amplitude aberration using the amplitude-aberration estimating mask pattern.

Another object of the present invention is to provide an amplitude-aberration eliminating filter for compensating for an amplitude aberration associated with an optical system.

In a projection printing apparatus of the present invention, the illumination light from a light source illuminates a photomask and the diffracted light from the illuminated photomask is focused on an exposed substrate through a projection optical system to project a circuit pattern, the optional projection system having a first halfmirror or beam splitter, a first concave mirror for reflecting the reflected or transmitted light from the first halfmirror, a second halfmirror or beam splitter provided separately from the first halfmirror, and a second concave mirror for reflecting the reflected or transmitted light from the second halfmirror.

With the two sets of a halfmirror and a concave mirror, one mirror can apply to a distribution of transmissivity and a shift of wavefront caused at the other halfmirror a distribution of transmissivity and a shift of wavefront having the opposite characteristics. Accordingly, the uneven distributions of transmissivity are offset by each other in the projection optical system and so are the shifts of wavefronts, and any uneven distribution of transmissivity associated with the generation of color center can be uniformed and any shift of wavefront can be eliminated.

Furthermore, unlike conventional examples of mirror systems which have no lenses, steric hindrance can be prevented, there is not a difference in behavior between a diffracted light beam on the right side and a diffracted light beam on the left side of a zero-order diffracted light beam, there is not a difference in imaging conditions between a longitudinal line and a lateral line, and superior image characteristics can be obtained.

In the above aspect, the first and second halfmirrors are preferably arranged in symmetry or similar symmetry with respect to a normal to an optical axis of a diffracted light beam directed from the first halfmirror to the second halfmirror.

Such an arrangement allows a distribution of transmissivity and a shift of wavefront caused in one halfmirror to be opposite in characteristics to those caused in the other halfmirror. Thus, any uneven distribution of transmissivity associated with the generation of color center can be uniformed, and any shift of wavefront can be offset.

In the above aspect, each of the reflection planes of the first and second halfmirrors is preferably arranged along each of imaginary lines which are symmetric with respect to a normal to an optical axis of a diffracted light beam directed from the first halfmirror to the second halfmirror. The first and second concave mirrors are arranged such that the arrangement direction of the first concave mirror with respect to the first halfmirror and the arrangement direction of the second concave mirror with respect to the second halfmirror are symmetric with respect to a normal.

Such an arrangement allows a distribution of transmissivity and a shift of wavefront caused in one halfmirror to be opposite in characteristics to those caused in the other halfmirror. Thus, any uneven distribution of transmissivity associated with the generation of color center can be uniformed, and any shift of wavefront can be offset.

In the above aspect, preferably, a diffracted light beam from a photomask illuminates the first concave mirror via the first halfmirror. Then, it is reflected from the first concave mirror and then illuminates the second concave mirror via the first and second halfmirrors. Then, it is reflected from the second concave mirror and then forms an image on the exposed substrate via the second halfmirror. The first and second halfmirrors and the first and second concave mirrors are arranged such that a diffracted light beam from the photomask follows such a path to form an image on the exposed substrate.

Such an arrangement allows a distribution of transmissivity and a shift of wavefront caused in one halfmirror to be opposite in characteristics to those caused in the other halfmirror. Thus, any uneven distribution of transmissivity associated with the generation of color center can be uniformed, and any shift of wavefront can be offset.

In the above aspect, preferably, a diffracted light beam from a photomask is transmitted through the first halfmirror. Then, it is reflected from the first concave mirror, the first and second halfmirrors successively and then by the second concave mirror, and is then transmitted through the second halfmirror to form an image on the exposed substrate. The first and second halfmirrors and the first and second concave mirrors are arranged such that a diffracted light beam follows such a path to form an image on the exposed substrate. Since each member is arranged such that a diffracted light beam follows such a path, a distribution of transmissivity and a shift of wavefront caused in one halfmirror can be opposite in characteristics to those caused in the other halfmirror. Thus, any uneven distribution of transmissivity associated with the generation of color center can be uniformed, and any shift of wavefront can be eliminated.

In the above aspect, preferably, a diffracted light beam from a photomask is reflected from the first halfmirror. Then, it is reflected from the first concave mirror and transmitted through the first and second halfmirrors successively. Then, it is reflected from the second concave mirror and then reflected from the second halfmirror to form an image on the exposed substrate. The first and second halfmirrors and the first and second concave mirrors are arranged such that a diffracted light beam from a photomask follows such a path and forms an image on the exposed substrate. Since each member is arranged such that a diffracted light beam follows such a path, a distribution of transmissivity and a shift of wavefront caused in one halfmirror can be opposite in characteristics to those caused in the other halfmirror. Thus, any uneven distribution of transmissivity associated with the generation of color center can be uniformed, and any shift of wavefront can be eliminated.

In the above aspect, preferably, at least one of the first halfmirror, the second halfmirror and a pupil plane located between the first and the second halfmirrors is also provided with a filter for eliminating wavefront aberration. This allows elimination of wavefront aberration.

In the above aspect, preferably, at least one of the first halfmirror, the second halfmirror and a pupil plane located between the first and second halfmirrors is also provided with a filter for eliminating amplitude aberration. This allows elimination of amplitude aberration.

A projection printing method according to the present invention includes the following steps: First, illumination light from a light source illuminates a photomask. Then, the diffracted light from the photomask reaches the first concave mirror via the first halfmirror and is reflected from the first concave mirror. Then, the diffracted light reflected from the first concave mirror reaches the second concave mirror via the first and second halfmirrors and is reflected from the second concave mirror. Then, the diffracted light reflected from the second concave mirror forms an image on the exposed substrate via the second halfmirror.

Since a diffracted light follows such a path for exposure, one halfmirror can provide to an uneven distribution of transmissivity and a shift of wavefront caused in the other halfmirror an uneven distribution of transmissivity and a shift of wavefront which have the opposite characteristics. Thus, the uneven distribution of transmissivity and the shift of wavefront caused in the other halfmirror can be offset by those caused in one halfmirror. Accordingly, any uneven distribution of transmissivity associated with the generation of color center can be uniformed, and any shift of wavefront can be eliminated.

Furthermore, unlike conventional examples of mirror systems or the like from which lenses are completely eliminated, steric hindrance can be prevented, there is not a difference in behavior between a diffracted light beam on the right side and a diffracted light beam on the left side of a zero-order diffracted light beam, there is not a difference in imaging conditions between a longitudinal line and a lateral line, and superior image characteristics can thus be obtained.

In the above aspect, a diffracted light beam can be preferably transmitted through an amplitude-aberration eliminating filter which is located at at least one of the first halfmirror, the second halfmirror and a pupil plane located between the first and second halfmirrors to compensate for the amplitude aberration of the diffracted light beam. Amplitude aberration can thus be eliminated.

A mask pattern for estimating amplitude aberrations according to the present invention includes a transparent substrate, a micropattern and a larger pattern. The micropattern is selectively formed on the transparent substrate and substantially has a size of the limit of resolution. The larger pattern is selectively formed on the transparent substrate and has a size no less than five times the wavelength of exposure light. A plurality of sets of a micropattern and a larger pattern are arranged on the transparent substrate.

The quantities of various types of amplitude aberrations can be estimated by using the amplitude-aberration estimating mask to form a transferring pattern on the exposed substrate and observing the transferring pattern. The distribution of the quantity of light on the pupil is overwhelmingly high at the position of the zero-order diffracted light source image (i.e., near the center, and estimation of amplitude aberration thus requires a pattern which causes a diffracted light beam near the center of the pupil. It corresponds to a mask pattern of a size of no less than five times a wavelength $\lambda$ of exposure light. In other words, a larger pattern having a size of no less than five times wavelength $\lambda$ of the exposure light allows estimation of amplitude aberration.

A method of estimating the quantity of amplitude aberration according to the present invention includes the steps of: exposing the aforementioned amplitude-aberration estimating mask pattern to light to form a transfer pattern; observing the transfer pattern to extract a variation in at least any of the optical contrast and optimum dose of the micropattern and a variation in at least any of the optical contrast and optimum dose of the larger pattern; and estimating the quantity of an amplitude aberration from the quantities of the extracted variations in at least any of the optical contrasts and optimum doses of the micropattern and larger pattern.

The method of estimating the quantity of amplitude aberration according to the present invention allows precise estimation of the quantities of various amplitude aberrations.

In the above aspect, the quantity of spherical amplitude aberration is preferably estimated from the quantity of an extracted variation in the optical contrast between the micropattern and larger pattern. This allows estimation of the quantity of spherical amplitude aberration.

In the above aspect, the quantity of astigmatism amplitude aberration is preferably estimated from the quantity of the extracted variation in contrast between a longitudinal pattern element quantity and a lateral pattern element of the micropattern and larger pattern. This allows estimation of the quantity of astigmatism amplitude aberration.

In the above aspect, the quantity of amplitude field curvature is preferably estimated from the quantity of the extracted variation in optical contrast among a plurality of larger patterns. This allows estimation of the quantity of amplitude field curvature.

In the above aspect, the quantity of coma amplitude aberration is preferably estimated from a quantity of an extracted variation in the optimum doses between the micropattern and larger pattern. This allows estimation of the quantity of coma amplitude aberration.

In the above aspect, the quantity of distortion amplitude aberration is preferably estimated from the quantity of an extracted variation in optimum dose of the micropattern and the larger pattern depending on the exposed position. This allows estimation of the quantity of distortion amplitude aberration.

An amplitude-aberration eliminating filter according to the present invention includes a transparent substrate and a translucent multilayered film having a shape capable of eliminating an amplitude aberration formed on the transparent substrate. A thickness of each film which configures the translucent multilayered film is represented by $n \times \lambda$, wherein λ represents a wavelength of a diffracted light beam and n represents an integer.

In the amplitude-aberration eliminating filter according to the present invention, the translucent multilayered film can be shaped depending on various amplitude aberrations to eliminate the various amplitude aberrations.

In the above aspect, the translucent multilayered film preferably has a concentric, domed shape a cross section of which is represented by a negative quartic function to eliminate a positive, spherical amplitude aberration. This allows elimination of positive, spherical amplitude aberration.

In the above aspect, the translucent multilayered film preferably has a concentric, mortar-like shape a cross section of which is represented by a positive quartic function to eliminate a negative, spherical amplitude aberration. This allows elimination of negative, spherical amplitude aberration.

In the above aspect, the translucent multilayered film preferably has that shape domed only in one direction a cross section of which is represented by a negative quadratic function to eliminate a positive, astigmatism amplitude aberration. This allows elimination of positive, astigmatism amplitude aberration.

In the above aspect, the translucent multilayered film preferably has that mortar-like shape only in one direction a cross section of which is represented by a positive quadratic function to eliminate a negative, astigmatism amplitude aberration. This allows elimination of negative, astigmatism amplitude aberration.

In the above aspect, the translucent multilayered film preferably has a concentric, domed shape a cross section of which is represented by a negative quadratic function to eliminate a positive, amplitude field curvature. This allows elimination of positive, amplitude field curvature.

In the above aspect, the translucent multilayered film preferably has a concentric, mortar-like shape a cross section of which is represented by a positive quadratic function to eliminate a negative, amplitude field curvature. This allows elimination of negative, amplitude field curvature.

In the above aspect, the translucent multilayered film preferably has that plane inclined in one direction a cross section of which is represented by a linear function. This allows elimination of distortion amplitude aberration.

In the above aspect, the translucent multilayered film preferably has that slope inclined in one direction a cross section of which is represented by a cubic function to eliminate a coma amplitude aberration. This allows elimination of coma amplitude aberration.

In the above aspect, the translucent multilayered film preferably has a distribution of transmissivity which compensates for a distribution of transmissivity obtained by synthesizing distributions of transmissivity resulting from amplitude aberrations detected by the above method of estimating the quantity of amplitude aberration. This allows elimination of all of the various amplitude aberrations and thus improves image quality.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 illustrates that an uneven distribution of transmissivity and a shift of wavefront in the projection printing apparatus according to the first embodiment of the present invention are compensated for.

FIGS. 7A and 7B show an optical contrast of a micropattern and an optical contrast of a larger pattern, respectively, in a method of estimating spherical amplitude aberration according to a tenth embodiment of the present invention.

FIGS. 10A and 10B show a quantity in variation of the optimum dose for a micropattern and a quantity in variation of the optimum dose for a larger pattern, respectively, in a method of estimating coma amplitude aberration according to a thirteenth embodiment of the present invention.

DESCRIPTION OF THE PREFERRED EMBODIMENTS

The embodiments of the present invention will now be described with reference to the drawings.

First Embodiment

Figure 1:
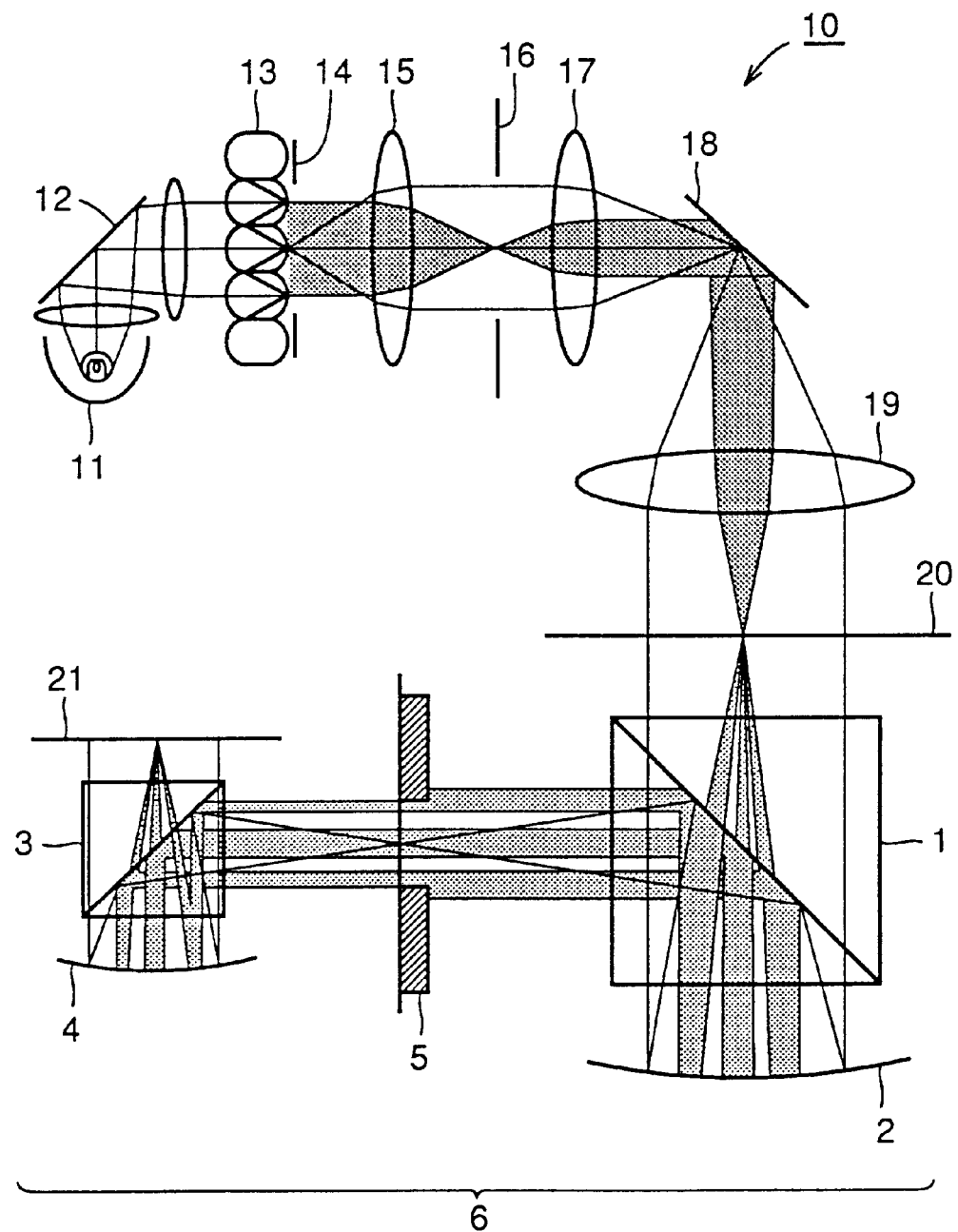
FIG. 1 is a schematic view of a configuration of a projection printing apparatus according to a first embodiment of the present invention.

In a projection printing apparatus 10 according to the present embodiment shown in FIG. 1, a fly-eye lens 13 is arranged in front of a lamp housing 11 with a mirror 12 interposed therebetween and an aperture 14 is positioned in front of fly-eye lens 13. A blind 16 is arranged in front of aperture 14 with a condenser lens 15 interposed therebetween, and a photomask 20 having a desired circuit pattern formed thereon is also arranged in front of blind 16 with a condenser lens 17, a mirror 18 and a condenser lens 19 interposed therebetween.

A wafer 21 as an exposed substrate is arranged in front of photomask 20 with a projection optical system 6 interposed therebetween.

Projection optical system 6 has a first halfmirror or beam splitter 1, a first concave mirror 2, a pupil plane 5, a second halfmirror a beam splitter 3 and a second concave mirror 4. The first halfmirror 1 is positioned in front of a photomask 20, and the first concave mirror 2 is arranged such that transmitted light from the first halfmirror 1 can be reflected toward the first halfmirror 1. Pupil plane 5 is arranged such that light reflected form the first halfmirror 1 can pass through pupil plane 5, and the second halfmirror 3 is arranged such that the light passing through pupil plane 5 can enter the second halfmirror 3. The second concave mirror 4 is arranged such that light reflected from the second halfmirror 3 can be reflected toward the second halfmirror 3. Then, the diffracted light reflected from the second concave mirror 4 is transmitted through the second halfmirror 3 and then forms an image on an exposure substrate 21.

Figure 2:
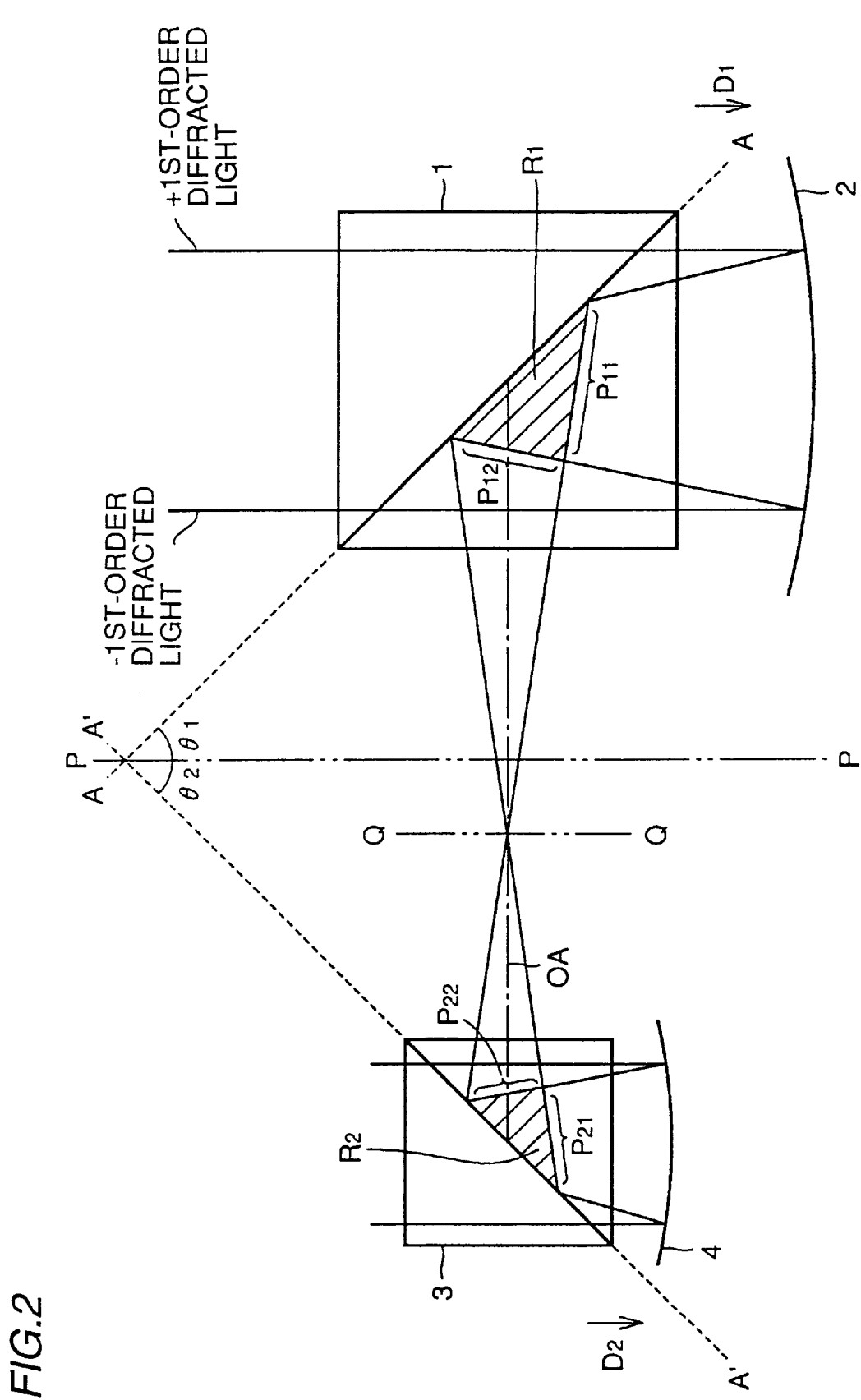

Particularly as shown in FIG. 2, the reflection plane of the first halfmirror 1 and the reflection plane of the second halfmirror 3 are arranged along imaginary lines A—A and A'—A', respectively, which are in symmetry (i.e., line symmetry) with respect to a normal P—P to an optical axis OA of diffracted light directed from the first halfmirror 1 to the second halfmirror 3. An angle $\theta_1$ between imaginary line A—A and normal P—P is substantially equal to an angle $\theta_2$ between imaginary line A'—A' and normal P—P. Furthermore, the first and second concave mirrors 2 and 4 are arranged such that the arrangement direction ($D_1$) of the first concave mirror 2 with respect to the first halfmirror 1 and the arrangement direction ($D_2$) of the second concave mirror 4 with respect to the second halfmirror 3 are symmetric with respect to normal P—P.

The first and second halfmirrors 1 and 3 are arranged in symmetry or similar symmetry with respect to a normal Q—Q to optical axis OA passing that point on pupil plane 5 at which a light source image is formed. Furthermore, the first and second halfmirrors 1 and 3 and the first and second concave mirrors 2 and 4 are arranged such that the optical path of a diffracted light beam in symmetry or "similar symmetry" with respect to normal Q—Q. "Similar symmetry" means that the halfmirror or the locus of an optical path on the left side of normal Q—Q in the figure has a similar figure of the line-symmetrical figure of the halfmirror or the locus of the optical path in the right side of normal Q—Q in the figure.

It should be noted that the first and second halfmirrors 1 and 3 have identical or similar figures to each other, and the first and second concave mirrors 2 and 4 also have identical or similar figures to each other.

A projection printing method employing this projection printing apparatus will now be described. Referring to FIG. 1, ultraviolet rays from a mercury vapor lamp or excimer laser 11 are reflected from mirror 12 and then divided into separate, point light sources by fly-eye lens 13 and shaped by aperture 14 to form the secondary light source plane. After it is transmitted through condenser lens 15, blind 16 sets an exposure area and photomask 20 is illuminated via condenser lens 17, mirror 18 and condenser lens 19. The light which has passed through photomask 20 is diffracted by a mask pattern to generate diffracted light. Only positive and negative first-order diffracted light beams are representatively shown in FIG. 1, although higher-order diffracted light beams are also present.

The diffracted light from photomask 20 is split by the first halfmirror 1 into transmitted light and reflected light, and then the transmitted light is reflected from the first concave mirror 2 and then plane-reflected from the first halfmirror 1 to form a light source image on pupil plane 5. Then, the diffracted light which can be transmitted through pupil plane 5 is plane-reflected from the second halfmirror 3 and then reflected from the second concave mirror 4. The diffracted light reflected from the second concave mirror 4 is transmitted through the second halfmirror 3 to form an image on exposure substrate 21. Exposure substrate 21 is then processed according to the optical image thus obtained.

With the projection printing apparatus and projection printing method according to the present invention, uneven distribution of transmissivity in projection optical systems can be compensated for and steric hindrance or degradation of image characteristics is not caused when the wave length of exposure light is less than 170 nm. This will now be described in detail.

Referring to FIG. 2, a hatched region $R_1$ in the first halfmirror 1 is a region at which the light transmitted through the first halfmirror, the light reflected from concave mirror 2 and the light reflected from the reflection plane of the first halfmirror 1 overlap one another. A hatched region $R_2$ in the second halfmirror 3 is also a region at which the light incident on the second halfmirror 3 from the first halfmirror 1, the light reflected from the reflection plane of the second halfmirror 3 and the light reflected from the concave mirror 4 overlap one another. The number of the color centers caused in the mirror material when the wavelength of exposure light is less than 170 nm is increased as the intensity of the light is increased. Thus, many color centers are produced and transmissivity is decreased particularly in hatched regions $R_1$ and $R_2$. The first and second halfmirrors 1 and 3 thus have a region with low transmissivity and a region with high transmissivity and this results in uneven distribution of transmissivity.

Assuming that the light beams indicated by solid line in the figure are the positive and negative first-order diffracted light beams, respectively, the positive and negative first-order diffracted light beams in halfmirror 1 pass through hatching region $R_1$ along optical paths $P_{11}$ and $P_{12}$, respectively. when the optical path length of optical path $P_{11}$ is different from that of optical path $P_{12}$, the quantity of the positive first-order diffracted light beam transmitted is different from that of the negative first-order diffracted light beam transmitted. More specifically, when optical path $P_{11}$ is longer than optical path $P_{12}$, the quantity of the positive first-order diffracted light beam transmitted is smaller than that of the negative first-order diffracted light beam transmitted.

In halfmirror 3, however, the negative and positive first-order diffracted light beams pass through hatched region $R_2$ along optical paths $P_{21}$ and $P_{22}$, respectively. It should be noted that optical paths $P_{21}$ and $P_{22}$ in hatched area $R_2$ correspond to optical paths $P_{11}$ and $P_{12}$ in hatched region $R_1$, respectively. Thus, when optical path $P_{11}$ is longer than optical path $P_{12}$, optical path $P_{21}$ is longer than optical path $P_{22}$ and the decreased quantity in transmission of the positive first-order diffracted light beam when it passes along optical path $P_{22}$ is smaller than that in transmission of the negative first-order diffracted light beam when it passes along optical path $P_{21}$.

Thus, the second halfmirror 3 applies that distribution of transmissivity which is opposite in characteristics to that of transmissivity caused in the first halfmirror 1 to the diffracted light. The distributions of transmissivity of the first and second halfmirrors 1 and 2 are compensated for by each other, the distributions of transmissivity of the first and second halfmirrors 1 and 3 are uniformed on the whole, and this prevents the lifetime of the lens system from being reduced due to unevenness in transmissivity.

Besides distribution of transmissivity, halfmirror 3 also applies that shift of wavefront which is opposite in characteristics to a shift of wavefront caused at halfmirror 1 to the a shift of wavefront caused at halfmirror 1, and thus the shifts of wavefronts caused at halfmirrors 1 and 3 are offset by each other over the whole.

Furthermore, since the system is not a mirror system from which lenses are completely removed as in conventional examples, steric hindrance is not caused, there is not a difference in behavior between diffracted light beams on the right and left sides of a zero-order diffracted light beam, there is not a difference in imaging conditions between a longitudinal line and a lateral line, and good image characteristics can thus be obtained.

While aberration generally means wavefront aberration, the present application broadly defines aberration as a cause of degradation in image quality of optical images. A cause of degradation of image quality other than wavefront is uneven distribution of transmissivity in the material of lenses or mirrors. For example, for a system in which an image is formed with an interference caused by the zero-order diffracted light beam of 0.5 in amplitude and the first-order diffracted light beam of 0.6 in amplitude, image forming may be performed with the interference caused by the two diffracted light beams as long as an amplitude aberration is zero.

However, when the transmissivities of the zero- and first-order diffracted light beams are 1.0 and 0.9, respectively, due to an uneven distribution of transmissivity caused by color center in a portion of the lens material or due to an unevenness in efficiency of the antireflection coating on the lens surface, an image is formed with an interference by an amplitude of 0.5 (=0.5×1.0) of the zero-order diffracted light beam and an amplitude of 0.54 (=0.6×0.9) of the first-order diffracted light beam. Since the intensity of light corresponds to the square of amplitude, the optical contrast of an optical image changes (generally, it is degraded) when the amplitude is offset from the optimum value.

While the degradation of image quality caused by disorder in wavefront distribution is referred to as wavefront aberration, the degradation of image quality caused by disorder in amplitude distribution will be referred to as "amplitude aberration" in the present application. For example, when a distribution of the transmissivity of a lens is concentric and represented by a quartic function, it will be referred to as "spherical amplitude aberration" after spherical aberration of wavefront aberration. When a distribution of the transmissivity of a lens is different with respect to xy, it will be referred to as "astigmatism amplitude aberration" or "coma amplitude aberration" after astigmatism aberration or coma aberration. When an uneven distribution of the optimum dose is observed within an image plane, it will be referred to as "amplitude field curvature" or "distortion amplitude aberration" after field curvature or distortion aberration.

In the present embodiment, the second halfmirror 3 applies that amplitude distribution which is opposite in characteristics to that caused at the first halfmirror 1 to the amplitude distribution caused at the first halfmirror 1, and the amplitude distribution caused at the first halfmirror 1 is thus offset.

Figure 3:
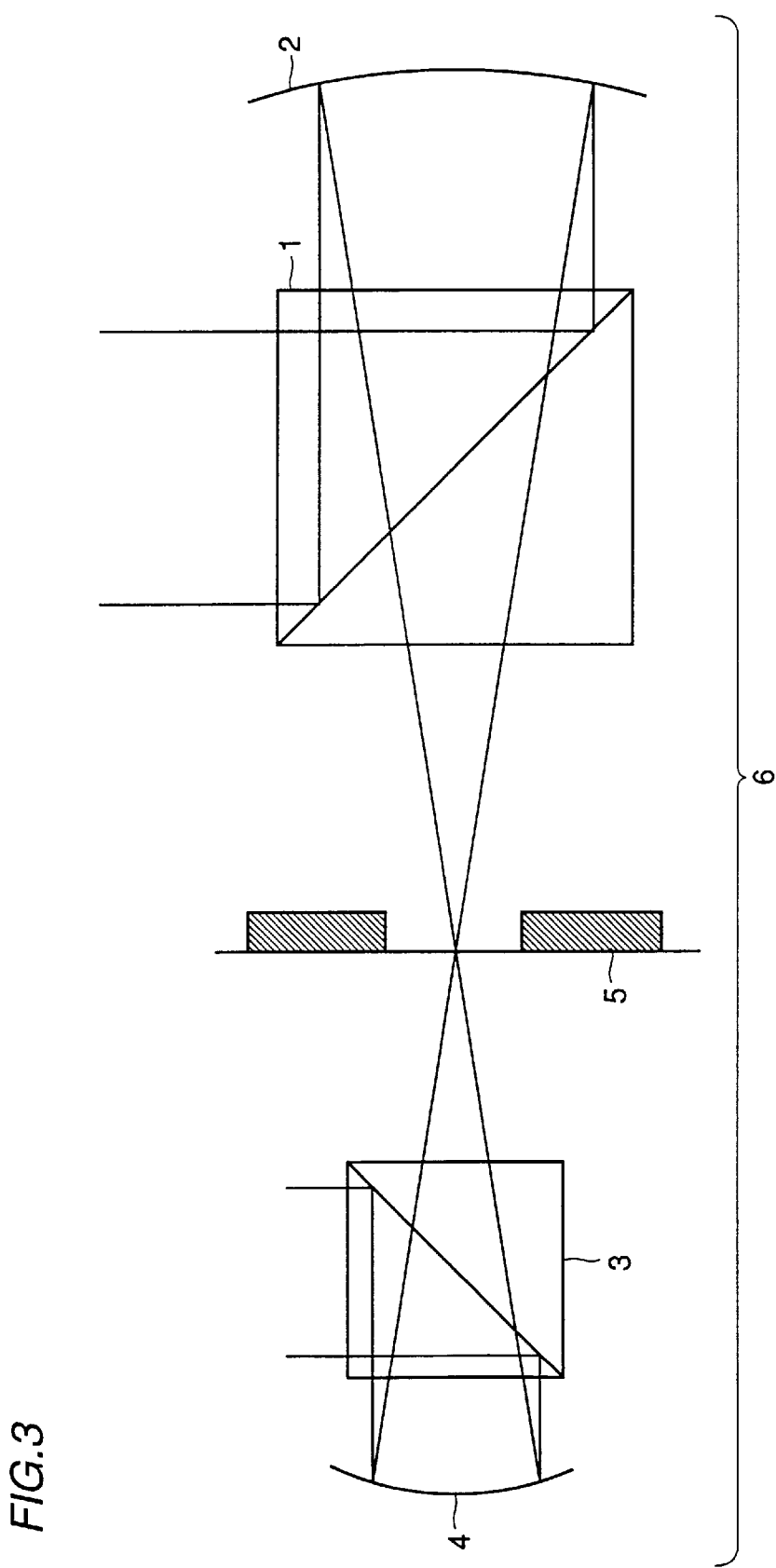
FIG. 3 is a schematic view of another arrangement of halfmirrors and concave mirrors.

While the first and second halfmirrors 1 and 3 and the first and second concave mirrors 2 and 4 are arranged in the present embodiment so that light is transmitted and reflected as shown in FIGS. 1 and 2, they may be arranged so that light is transmitted and reflected as shown in FIG. 3.

More specifically, as shown in FIG. 3, the first halfmirror 1 is arranged in front of photomask 20, and the first concave mirror 2 is arranged such that the reflected light from the first halfmirror 1 can be reflected toward the first halfmirror 1. Pupil plane 5 is arranged such that the transmitted light from the first halfmirror 1 can pass through pupil plane 5, and the second halfmirror 3 is arranged such that the light which passes through pupil plane 5 can enter the second halfmirror 3. The second concave mirror 4 is arranged such that the transmitted light through the second halfmirror 3 can be reflected toward the second halfmirror 3. The diffracted light reflected from the second concave mirror 4 is reflected from the second halfmirror 3 and forms an image on exposed substrate 21.

Such an arrangement of the members also allows the second halfmirror 3 to apply a transmissivity distribution the characteristics of which are opposite to the transmissivity distribution caused in the first halfmirror, as described above, and thus any uneven distribution of transmissivity can be uniformed on the whole.

Furthermore, the second halfmirror 3 can apply a shift of wavefront which is opposite in characteristics to that of wavefront caused in the first halfmirror 1 and thus the shifts of wavefronts are offset by each other.

Furthermore, the second halfmirror 3 similarly applies that amplitude distribution which is opposite in characteristics to that caused in the first halfmirror 1 to the amplitude distribution caused in the first halfmirror 1, and thus the amplitude distributions are offset by each other.

Second Embodiment

Figure 4:
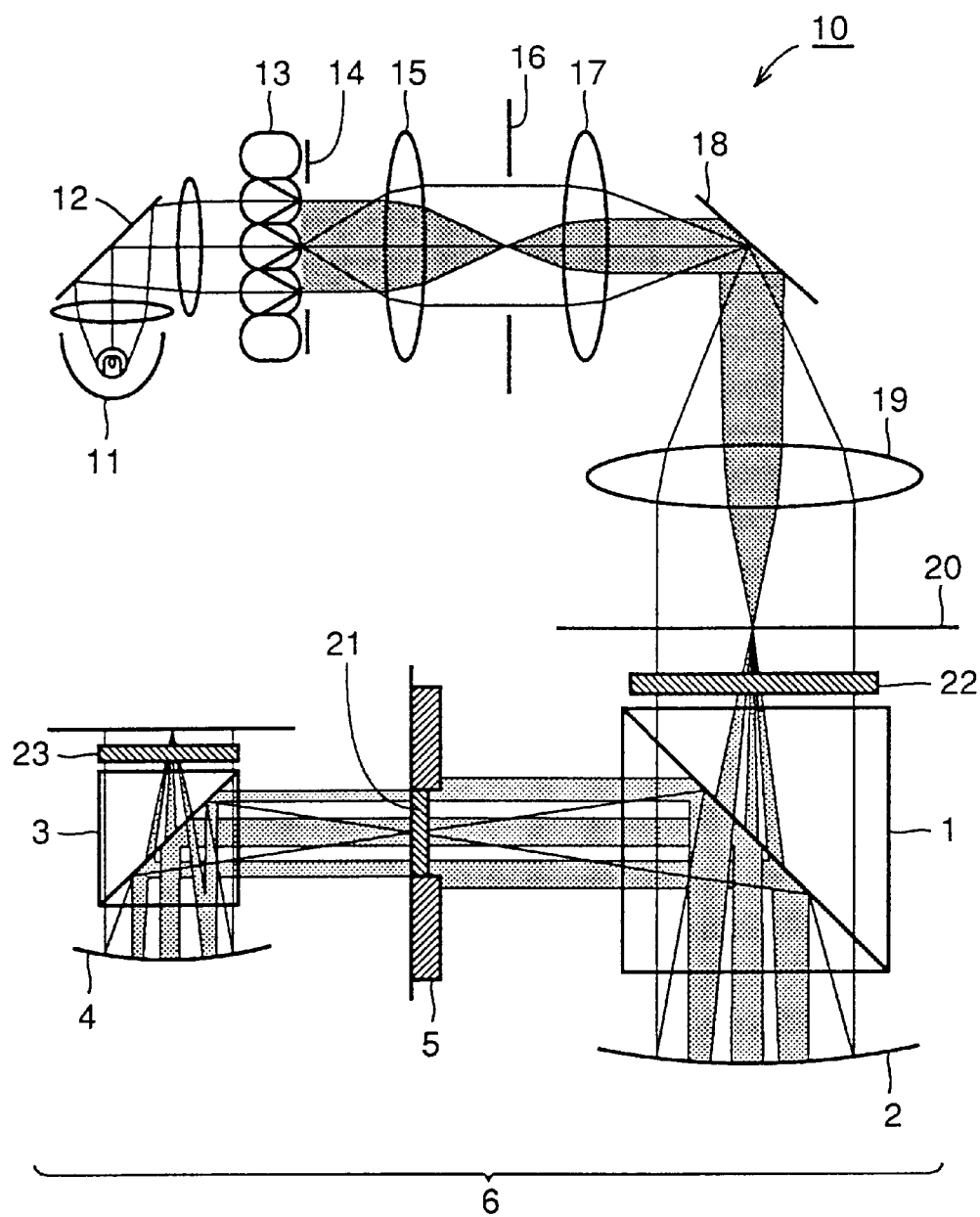
FIG. 4 is a schematic view of a configuration of the projection printing apparatus shown in FIG. 1 plus a spatial filter.

Referring to FIG. 4, when a spatial filter 24 for eliminating wavefront aberration is provided at pupil plane 5 in projection optical system 6 of the projection printing apparatus according to the first embodiment, spherical aberration, astigmatism aberration and coma aberration can mainly be eliminated and good image quality can be obtained.

Third Embodiment

Referring to FIG. 4, when a spatial filter 22 for eliminating wavefront aberration is provided at the first halfmirror 1 in projection optical system 6 of the projection printing apparatus according to the first embodiment, field curvature and distortion aberration can mainly be eliminated and good image quality can be obtained.

Fourth Embodiment

Referring to FIG. 4, when a spatial filter 23 for eliminating wavefront aberration is provided at the second halfmirror 3 in projection optical system 6 of the projection printing apparatus according to the first embodiment, field curvature and distortion aberration can mainly be eliminated and good image quality can be obtained.

It should be noted that spatial filters 24, 22 and 23 for eliminating wavefront aberration described in the second, third and fourth embodiments have, for example, a transparent substrate and a transparent multilayer film formed thereon.

Fifth Embodiment

Referring to FIG. 4, when spatial filter 24 for eliminating amplitude aberration is provided at pupil plane 5 in projection optical system 6 of the projection printing apparatus according to the first embodiment, spherical amplitude aberration, astigmatism amplitude aberration and coma amplitude aberration can mainly be eliminated and good image quality can be obtained.

Sixth Embodiment

Referring to FIG. 4, when spatial filter 22 for eliminating amplitude aberration is provided at the first halfmirror 1 in projection optical system 6 of the projection printing apparatus according to the first embodiment, amplitude field curvature and distortion amplitude aberration can mainly be eliminated and good image quality can be obtained.

Seventh Embodiment

Referring to FIG. 4, when spatial filter 23 for eliminating amplitude aberration is provided at the second halfmirror 3 in projection optical system 6 of the projection printing apparatus according to the first embodiment, amplitude filed curvature and distortion amplitude aberration can mainly be eliminated and good image quality can be obtained.

Eighth Embodiment

Figure 5:
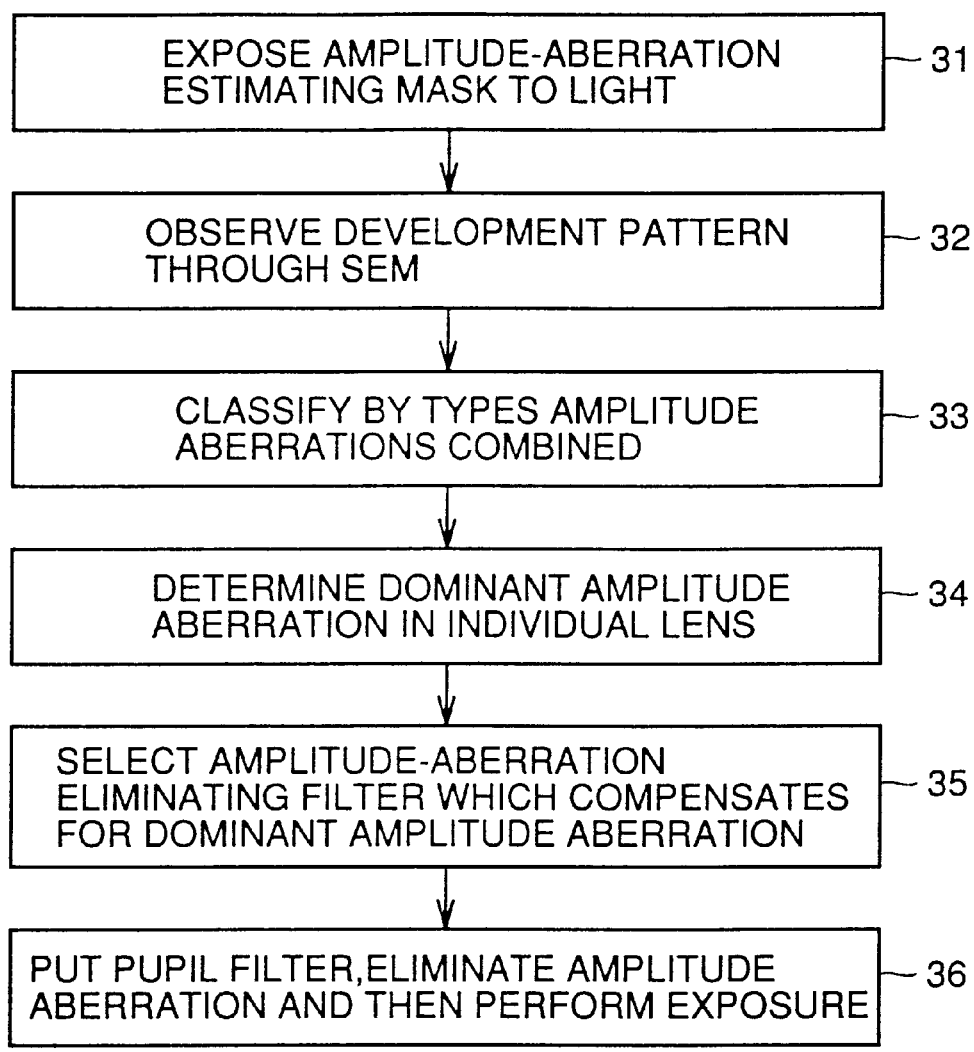
FIG. 5 is a flow chart of a projection printing method according to an eighth embodiment of the present invention.

Referring to FIG. 5, a mask pattern for estimating amplitude aberration is first exposed to light (step 31) and a development pattern obtained by the exposure is observed through an SEM (Scanning Electron Microscope) (step 32). According to the result of the observation, the types of the amplitude aberrations combined are classified (step 33). Furthermore, the amplitude aberration which is dominant in an individual lens is determined (step 34) and then an amplitude-aberration eliminating filter which compensates for the dominant amplitude aberration is selected (step 35). The amplitude-aberration eliminating filter (a pupil filter) thus selected is put onto, for example, the pupil plane for exposure of a circuit pattern (step 36).

Application of such an exposure method allows selective elimination of the amplitude aberration which is dominant in an individual lens, and hence good image characteristics.

Ninth Embodiment

Figure 6A:
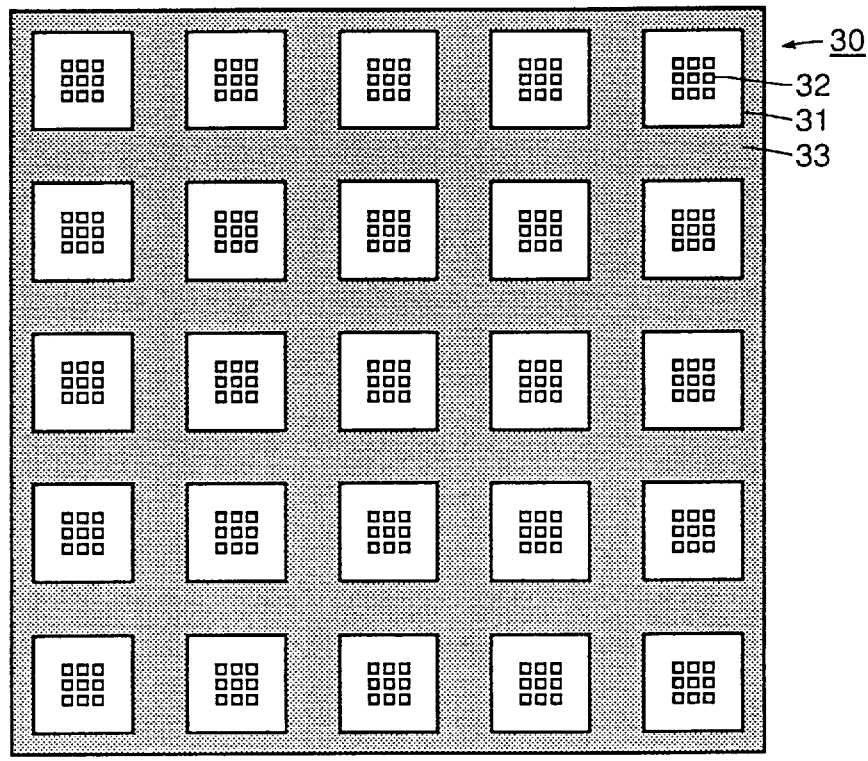
FIG. 6A is a plan view of a mask pattern for estimating amplitude aberrations according to a ninth embodiment of the present invention.

Referring to FIG. 6A, a total of 25 rectangular, larger patterns 31 arranged in a matrix of five columns and five rows are formed on a transparent substrate 33, and a total of nine micropatterns 32 arranged in a matrix of three rows and three columns are formed in each larger patter 31. Larger pattern 31 has a size of no less than five times, e.g., approximately ten times, the wavelength of exposure light. Micropattern 32 has substantially the same size as the limit of resolution of the projection printing apparatus used.

Figure 6B:
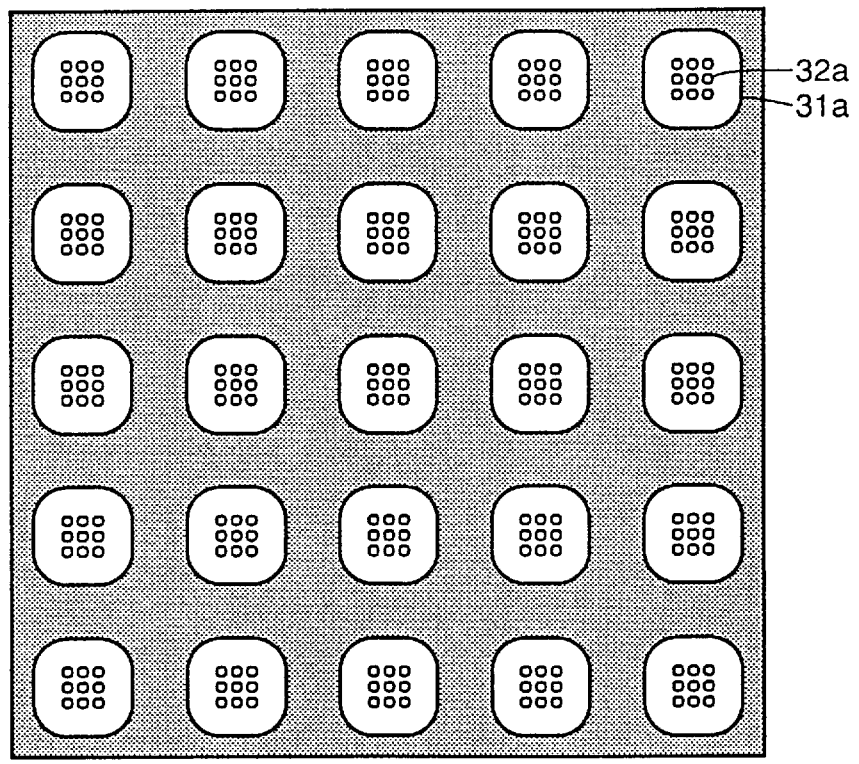
FIG. 6B shows a transferring pattern obtained by exposing the mask pattern shown in FIG. 6A.

When mask pattern 30 for estimating amplitude aberration is exposed to light by means of an aplanatic lens, the corners of the larger patters and micropatterns are rounded off due to diffraction and a transferring pattern containing larger patterns 31a and micropatterns 32a as shown in FIG. 6B is obtained. Generally, micropatterns are sensitive to aberrations, whereas larger patterns are less sensitive to aberrations. Thus, amplitude aberrations can be readily and clearly classified into the five types of amplitude aberrations by observing larger patterns 31a and micropatterns 32a in the transferring pattern.

The distribution of the quantity of light on the pupil is overwhelming high at the position of the zero-order diffracted light source image (i.e., near the center) and thus estimation of amplitude aberration requires a pattern which creates diffracted light around the center of the pupil. It corresponds to a mask pattern having a size of no less than five times a wavelength $\lambda$ of exposure light. In other words, larger patterns 31 having a size of no less than five times wavelength $\lambda$ of exposure light allows estimation of amplitude aberration. Therefore, use of the mask pattern according to the present embodiment allows estimation of amplitude aberration.

Tenth Embodiment

A method of estimating spherical amplitude aberration, using mask pattern 30 for estimating amplitude aberration shown in FIG. 6A, will now be described. First, mask pattern 30 for estimating amplitude aberration shown in FIG. 6A is exposed to light and twenty-five sets of transferring patterns finished as shown in FIG. 6B are observed through an SEM or the like. Thus, the optical contrast of micropattern 32 is obtained at each of the twenty-five points, as shown in FIG. 7A, while the optical contrast of larger pattern 31 is obtained at each of the twenty-five points, as shown in FIG. 7B.

It should be noted that in FIGS. 7A and 7B, the length of an arrow indicates the level of an optical contrast.

As shown in FIGS. 7A and 7B, if any difference in contrast is observed in quartic function between the ideal optical image and the optical images of micropattern 32 and larger pattern 31, it is proved that a spherical amplitude aberration is present in the optical system used. The quantity of the spherical amplitude aberration can be estimated from the variation of the contrast between micropattern 32 and larger pattern 31.

Eleventh Embodiment

A method of estimating astigmatism amplitude aberration with the use of mask pattern 30 for estimating amplitude aberration shown in FIG. 6A will now be described. First, mask pattern 30 for estimating amplitude aberration shown in FIG. 6A is exposed to light, and twenty-five sets of transferring patterns finished as shown in FIG. 6B are observed through an SEM or the like. Thus, the optical contrast of a lateral (x direction) pattern element or side of each pattern is obtained at each of the twenty-five points, as shown in FIG. 8A, whereas the optical contrast of a longitudinal (y direction) pattern element or side of each pattern is obtained at each of the twenty-five points, as shown in FIG. 8B.

Figure 8A:
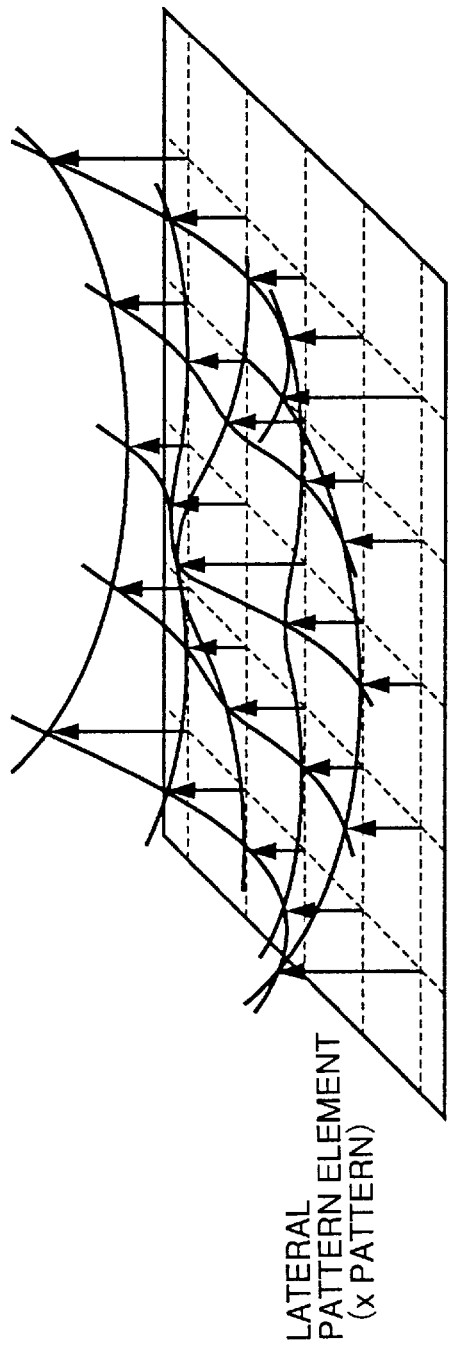
FIGS. 8A and 8B show a quantity in variation of the optical contrast of a lateral pattern element and a quantity in variation of the optical contrast of a longitudinal pattern element, respectively, in a method of estimating astigmatism amplitude aberration according to an eleventh embodiment of the present invention.
Figure 8B:
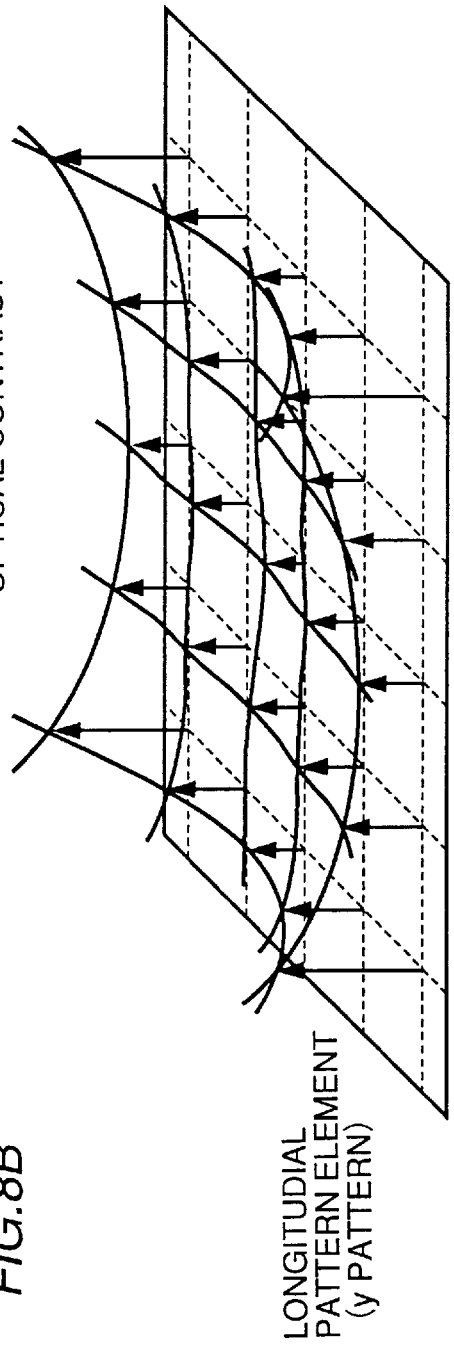

As shown in FIGS. 8A and 8B, if a contrast variation is observed between the lateral pattern element and the longitudinal pattern element, it is proved that an astigmatism amplitude aberration is present in the exposure optical system used. The quantity of the astigmatism amplitude aberration can be estimated from the quantity of the contrast variation between the lateral pattern element and the longitudinal pattern element.

Twelfth embodiment

A method of estimating amplitude field curvature with the use of mask pattern 30 for estimating amplitude aberration shown in FIG. 6A will now be described. First, mask pattern 30 for estimating amplitude aberration shown in FIG. 6A is exposed to light, and twenty-five sets of transferring patterns finished as shown in FIG. 6B are observed through an SEM or the like. The optical contrast of larger pattern 31 is thus obtained at each of the twenty-five points, as shown in FIG. 9.

Figure 9:
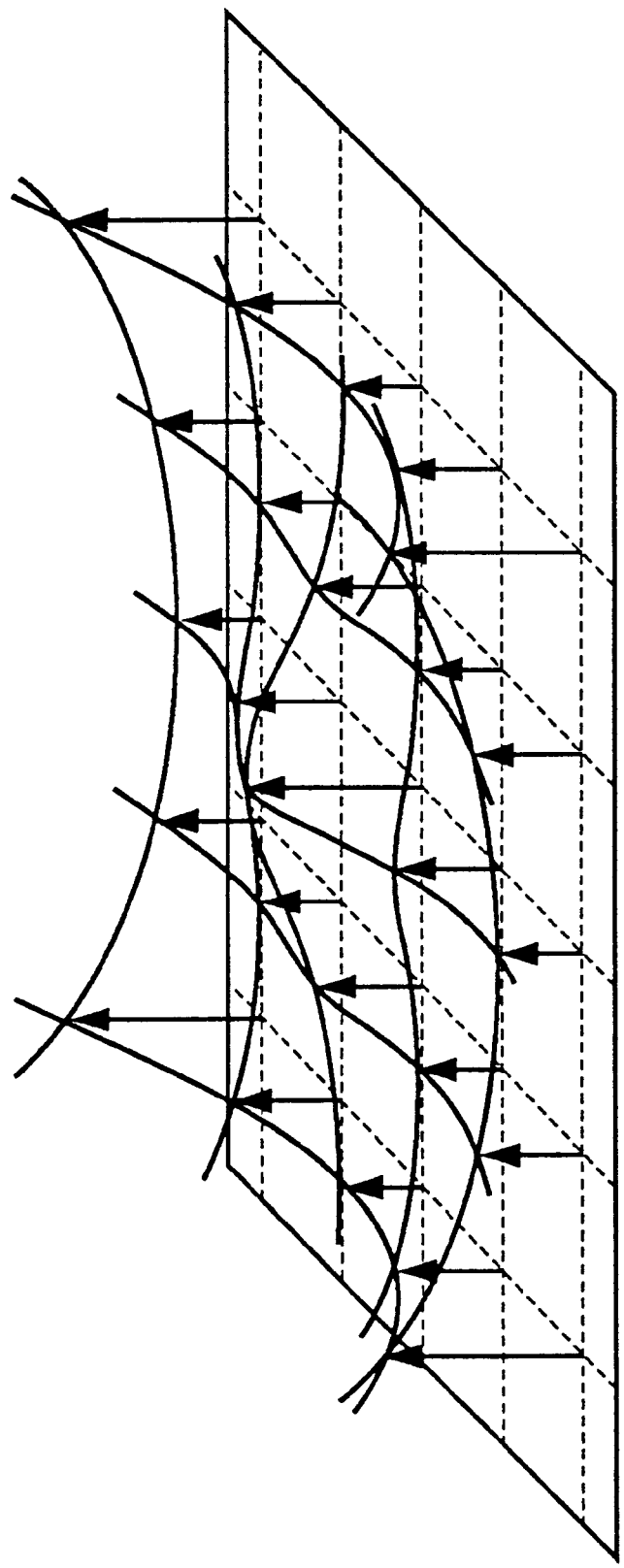
FIG. 9 shows a quantity in variation of an optical contrast of a larger pattern according to a twelfth embodiment of the present invention.

If the contrast of larger patter 31 is observed in quadratic function, as shown in FIG. 9, it is proved that an amplitude field curvature is present in the exposure optical system used. The quantity of the amplitude field curvature can be estimated from the quantity of the contrast variation of larger pattern 31.

Thirteenth Embodiment

A method of estimating coma amplitude aberration with the use of mask pattern 30 for estimating amplitude aberration shown in FIG. 6A will now be described. First, mask pattern 30 for estimating amplitude aberration shown in FIG. 6A is exposed to light while changing the conditions of exposure, and twenty-five sets of transferring patterns finished as shown in FIG. 6B are observed through an SEM or the like. Thus, the optimum dose for micropattern 32 is obtained at each of the twenty-five points, as shown in FIG. 10A, whereas the optimum dose for larger pattern 31 is obtained at each of the twenty-five points, as shown in FIG. 10B.

It should be noted that the length of an arrow shown in FIGS. 10A and 10B indicates the level of an optimum dose.

If a relative variation of optimum dose is observed between micropattern 32 and larger pattern 31, as shown in FIGS. 10A and 10B, it is proved that a coma amplitude aberration is present in the exposure optical system used. The quantity of the coma amplitude aberration can be estimated from the quantity of the relative variation in optimum dose when micropattern 32 and larger pattern 31 are compared with each other.

Fourteenth Embodiment

Figure 11:
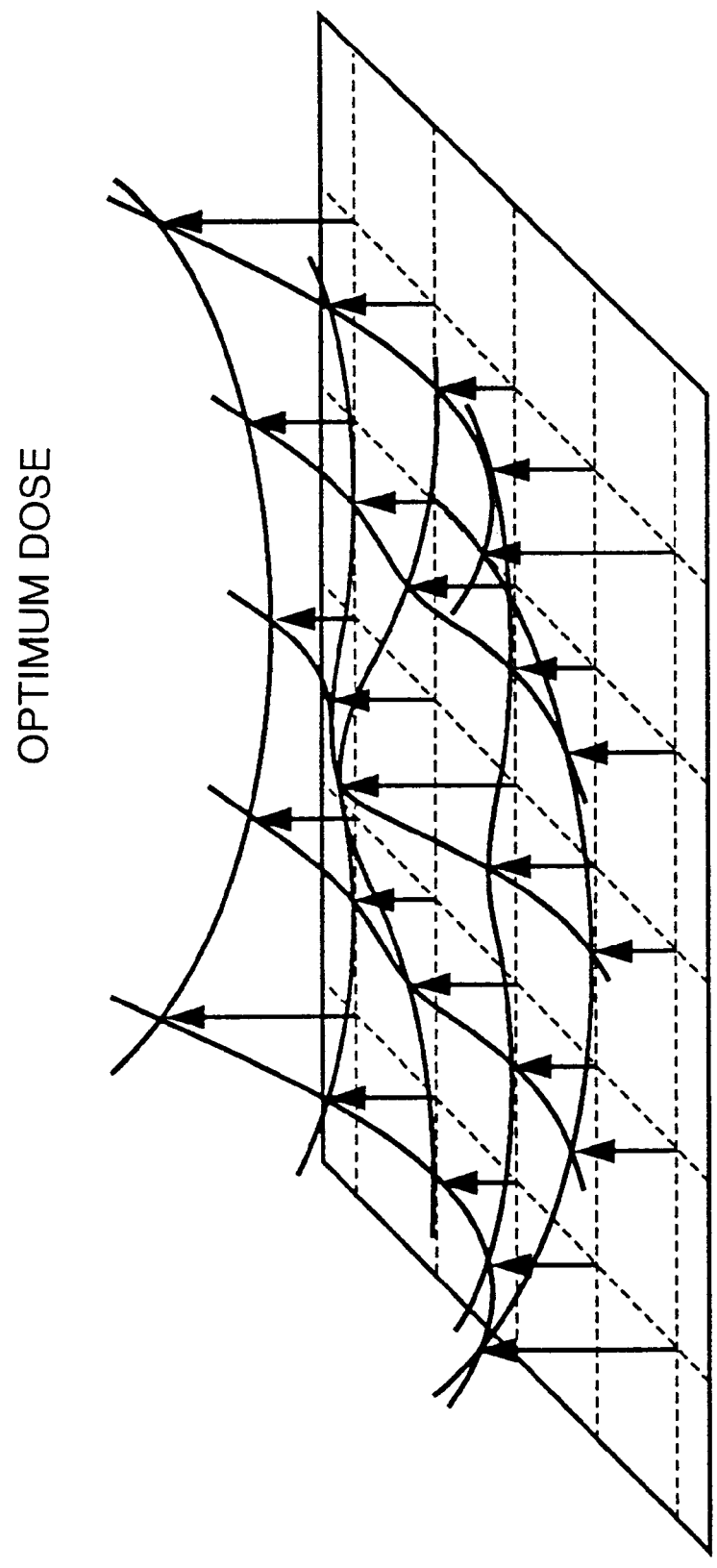
FIG. 11 illustrates a method of estimating distortion amplitude aberration according to a fourteenth embodiment of the present invention and shows a quantity in variation of the optimum dose for a larger pattern.

A method of estimating distortion amplitude aberration with the use of mask pattern 30 for estimating amplitude aberration shown in FIG. 6A, will now be described. First, mask pattern 30 for estimating amplitude aberration shown in FIG. 6A is exposed to light, and twenty-five sets of transferring patterns finished as shown in FIG. 6B are observed through an SEM or the like. Thus, the optimum dose for micropattern 32 is obtained at each of the twenty-five points, as shown in FIG. 11, whereas the optimum dose for larger pattern 31 is obtained at each of the twenty five points, as shown in FIG. 11.

If it is observed that while the optimum dose for micropattern 32 is relatively the same as that for larger pattern 31, the optimum dose varies depending on the exposed position, it is proved that a distortion amplitude aberration is present in the exposure optical system used. The quantity of the distortion amplitude aberration can be estimated form the quantity of the variation in optimum dose depending on the exposed position of micropattern 32 and larger pattern 31.

Fifteenth Embodiment

Figure 12A:
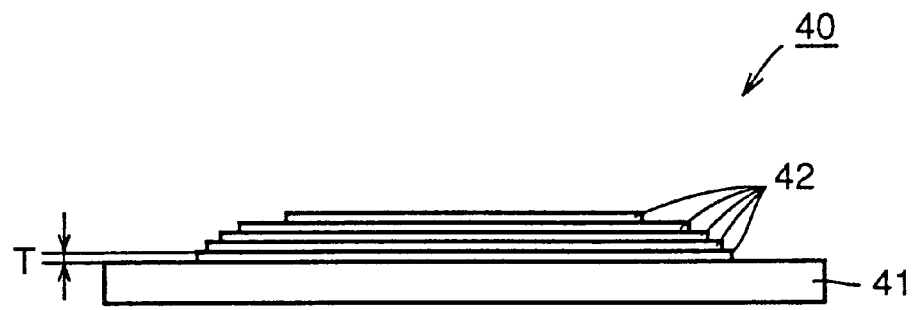
FIGS. 12A and 12B are a cross sectional view and a perspective view, respectively, of an amplitude-aberration eliminating filter which compensates for a positive, spherical amplitude aberration according to a fifteenth embodiment of the present invention.
Figure 12B:
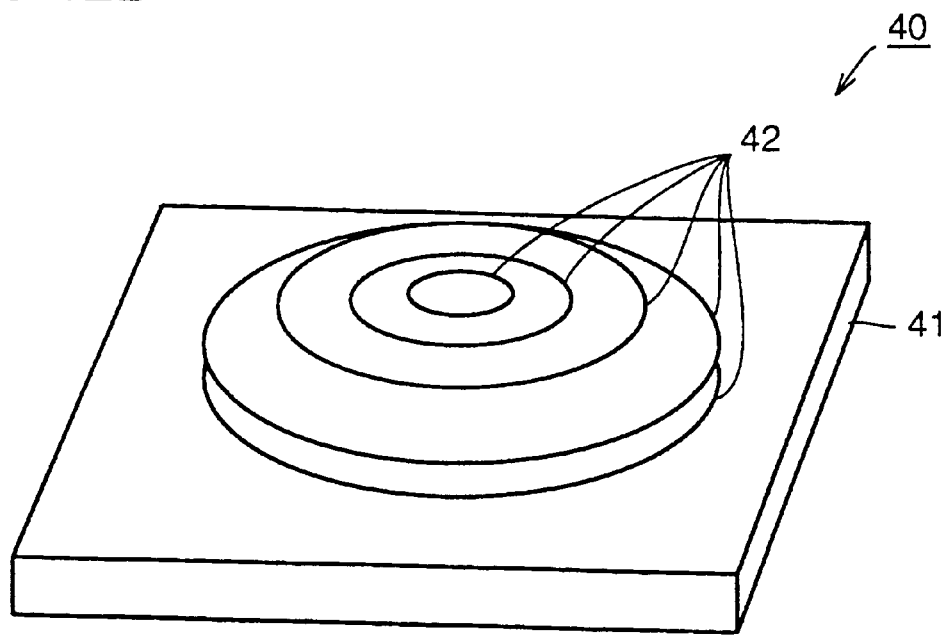

FIGS. 12A and 12B show a cross sectional view and a perspective view, respectively, of a filter for eliminating positive, spherical amplitude aberration according to a fifteenth embodiment of the present invention. a filter 40 for eliminating positive, spherical amplitude aberration has a transparent substrate 41 and a translucent multilayered film 42 formed on a surface of transparent substrate 41. The thickness of each layer of translucent multilayered film 42 is expressed as n×λ, wherein n represents an integer and λ represents a wavelength of exposure light.

Figure 25A:
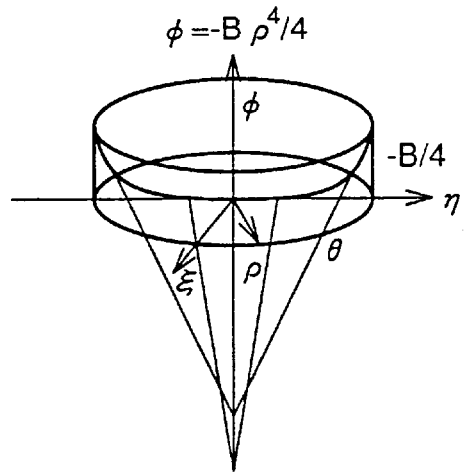
FIGS. 25A–25E shows typical wavefront aberrations on a pupil, namely, spherical aberration, astigmatism aberration, field curvature, distortion aberration and coma aberration, respectively.

As has been illustrated in FIG. 25A, when a spherical aberration is converted into a wavefront aberration on a pupil plane, the quantity of a shift of wavefront is expressed as $\phi=-B\rho^4/4$. Thus, when a dominant amplitude aberration in an optical system is a positive, spherical amplitude aberration, translucent multilayered film 42 for compensating for the positive, spherical amplitude aberration has a concentrical, domed shape a cross section of which is represented by a negative quartic function. By putting this filter 40 for eliminating amplitude aberration onto the pupil plane of the projection optical system, the positive, spherical amplitude aberration can be eliminated and image quality can be improved.

Sixteenth Embodiment

Figure 13A:
FIGS. 13A and 13B are a cross sectional view and a perspective view, respectively, of an amplitude-aberration eliminating filter which compensates for a negative, spherical amplitude aberration according to a sixteenth embodiment of the present invention.
Figure 13B:
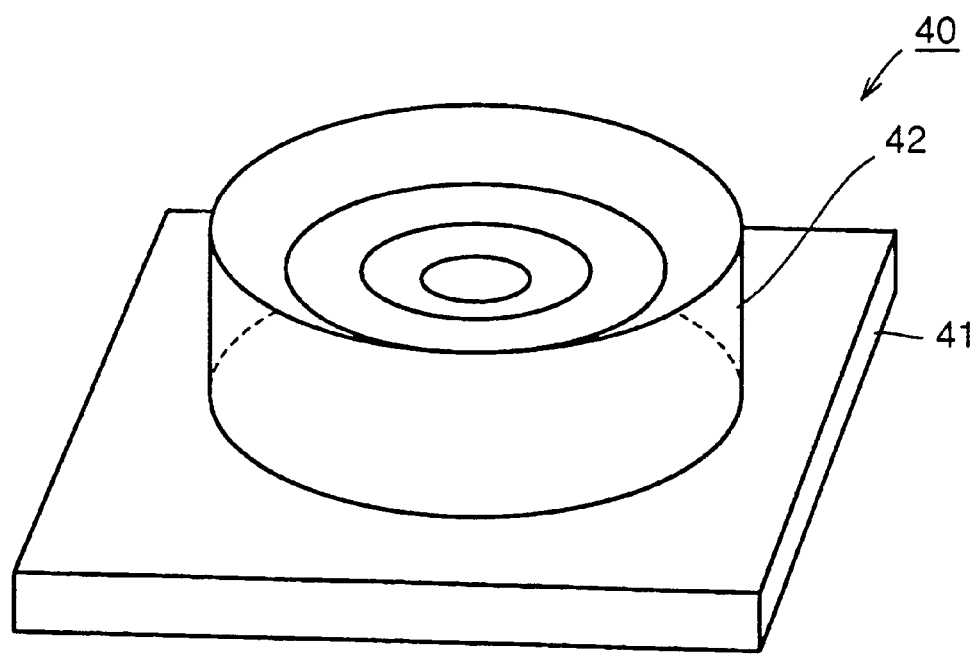

FIGS. 13A and 13B are across sectional view and a perspective view, respectively, of a filter for eliminating negative, spherical amplitude aberration according to a sixteenth embodiment of the present invention. A filter 40 for eliminating negative, spherical amplitude aberration has transparent substrate 41 and translucent multilayered film 42 formed on a surface of transparent substrate 41. The thickness of each layer of translucent multilayered film 42 is the same as described in the fifteenth embodiment, i.e., n×λ.

As has been illustrated in FIGS. 25A, when a spherical aberration is converted into a wavefront aberration on a pupil plane, the quantity φ of a shift of wavefront is represented as $\phi=-B\rho^4/4$. Thus, when a dominant amplitude aberration in an optical system is a negative, spherical amplitude aberration, translucent multilayered film 42 for compensating for the negative, spherical amplitude aberration has a concentrically mortar-like or conical shape a cross section of which is represented by a positive quartic function. By putting this filter 40 for eliminating amplitude aberration onto the pupil plane of the projection optical system, the negative, spherical amplitude aberration can be eliminated and image quality can be improved.

Seventeenth Embodiment

Figure 14A:
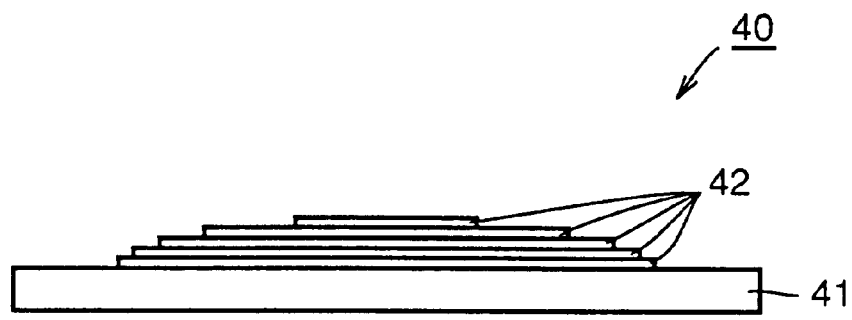
FIGS. 14A and 14B are a cross sectional view and a perspective view, respectively, of an amplitude-aberration eliminating filter which compensates for a positive, astigmatism amplitude aberration according to a seventeenth embodiment of the present invention.
Figure 14B:
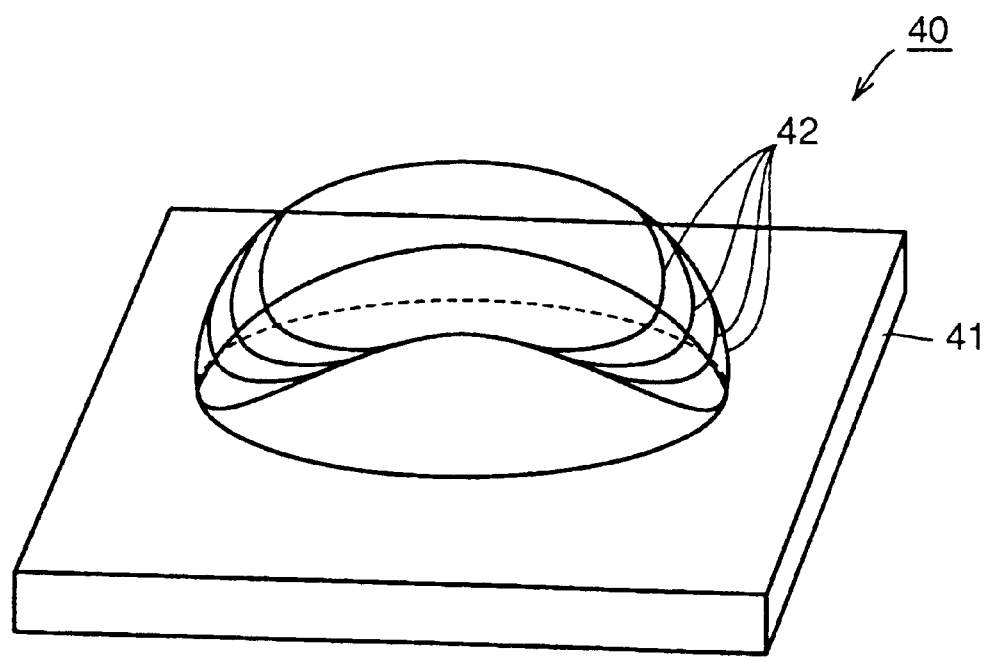

FIGS. 14A and 14B are a cross sectional view and a perspective view, respectively, of a filter for eliminating positive, astigmatism amplitude aberration according to a seventeenth embodiment of the present invention. Filter 40 for eliminating positive, astigmatism amplitude aberration has transparent substrate 41 and translucent multilayered film 42 formed on a surface of transparent substrate 41. The thickness of each layer of translucent multilayered film 42 is the same as described in the fifteenth embodiment, i.e., n×λ.

Figure 25B:
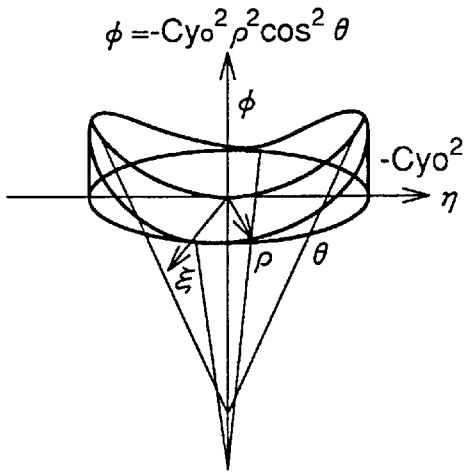

As has been illustrated in FIG. 25B, when an astigmatism aberration is converted into a wavefront aberration on a pupil plane, the quantity $\phi$ of a shift of wavefront is expressed as $\phi=-Cy_0^2\rho^2 \cos^2\theta$. Thus, when a dominant amplitude aberration in an exposure optical system is a positive, astigmatism amplitude aberration, translucent multilayered film 42 for compensating for the positive, astigmatism amplitude aberration has that shape domed only in one direction a cross section of which is represented by a negative quadratic function, i.e., the shape of a saddle. By putting this filter 40 for eliminating amplitude aberration onto the pupil plane of the projection optical system, the positive, astigmatism amplitude aberration can be eliminated and image quality can be improved.

Eighteenth Embodiment

Figure 15A:
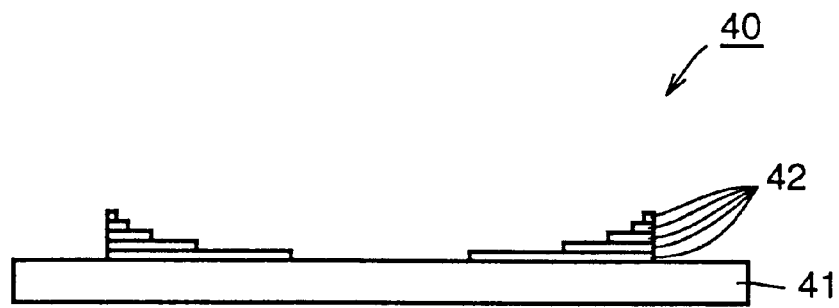
FIGS. 15A and 15B are a cross sectional view and a perspective view, respectively, of an amplitude-aberration eliminating filter which compensates for a negative, astigmatism amplitude aberration according to an eighteenth embodiment of the present invention.
Figure 15B:
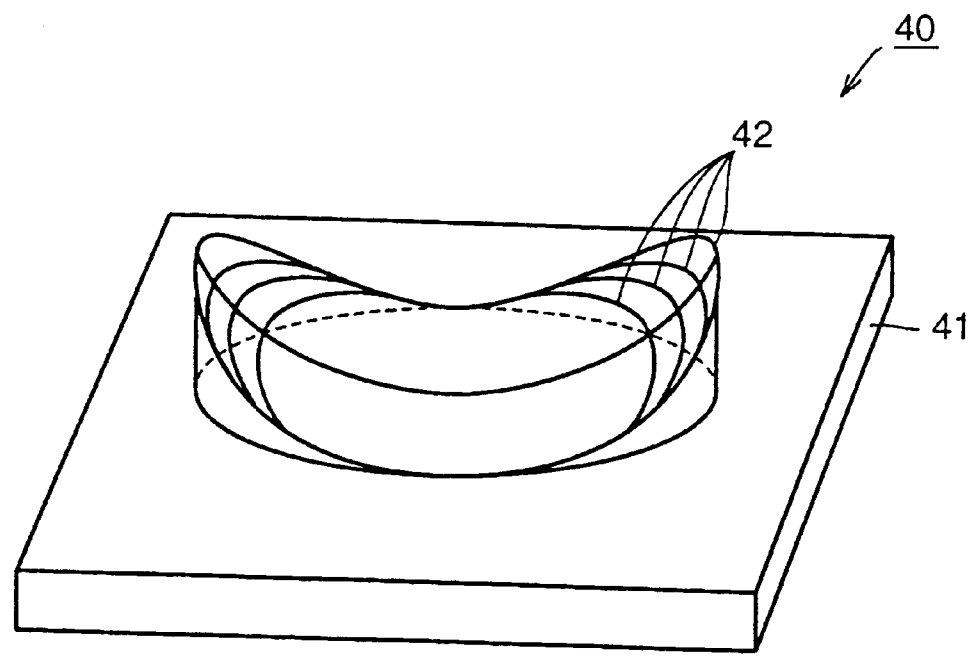

FIGS. 15A and 15B are a cross sectional view and a perspective view, respectively, of a filter for eleminating negative, astigmatism amplitude aberration according to an eighteenth embodiment of the present invention. Filter 40 for eliminating negative, astigmatism amplitude aberration has transparent substrate 41 and translucent multilayered film 42 formed on a surface of transparent substrate 41. The thickness of each layer of translucent multilayered film 42 is the same as described in the fifteenth embodiment, i.e., $n\times\lambda$.

As has been illustrated in FIG. 25B, when an astigmatism aberration is converted into a wavefront aberration on a pupil plane, the quantity $\phi$ of a shift of wavefront is expressed as $\phi=-Cy_0^2\rho^2 \cos^2\theta$. Thus, when a dominant amplitude aberration in an exposure optical system is a negative, astigmatism amplitude aberration, translucent multilayered film 42 for compensating for the negative, astigmatism amplitude aberration has that mortar-like or conical shape in one direction a cross section of which is represented by a positive quadratic function. By putting this filter 40 for eliminating amplitude aberration onto the projection optical system, the negative, astigmatism amplitude aberration can be eliminated and image quality can be improved.

Nineteenth Embodiment

Figure 16A:
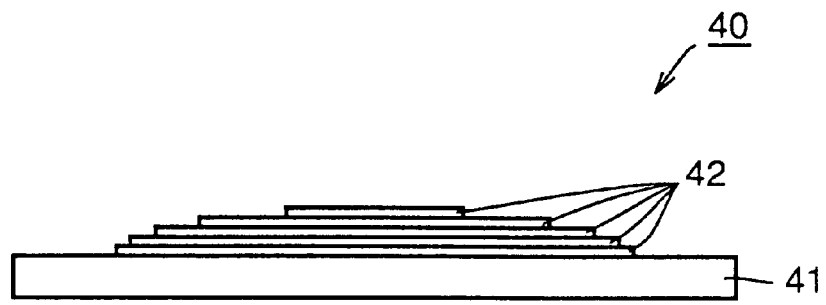
FIGS. 16A and 16B are a cross sectional view and a perspective view, respectively, of an amplitude-aberration eliminating filter which compensates for a positive, amplitude field curvature according to a nineteenth embodiment of the present invention.
Figure 17A:
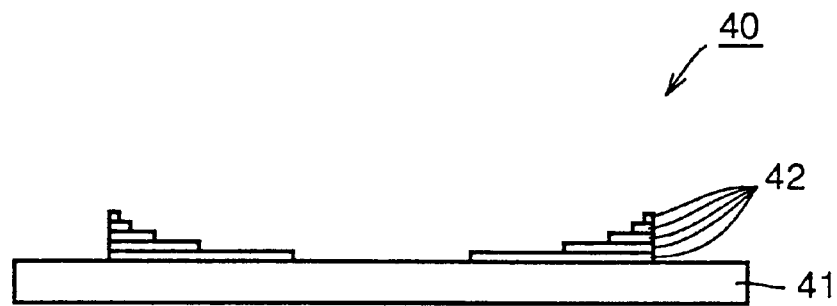
FIGS. 17A and 17B are a cross sectional view and a perspective view, respectively, of an amplitude-aberration eliminating filter which compensates for a negative, amplitude field curvature according to a twentieth embodiment of the present invention.
Figure 17B:
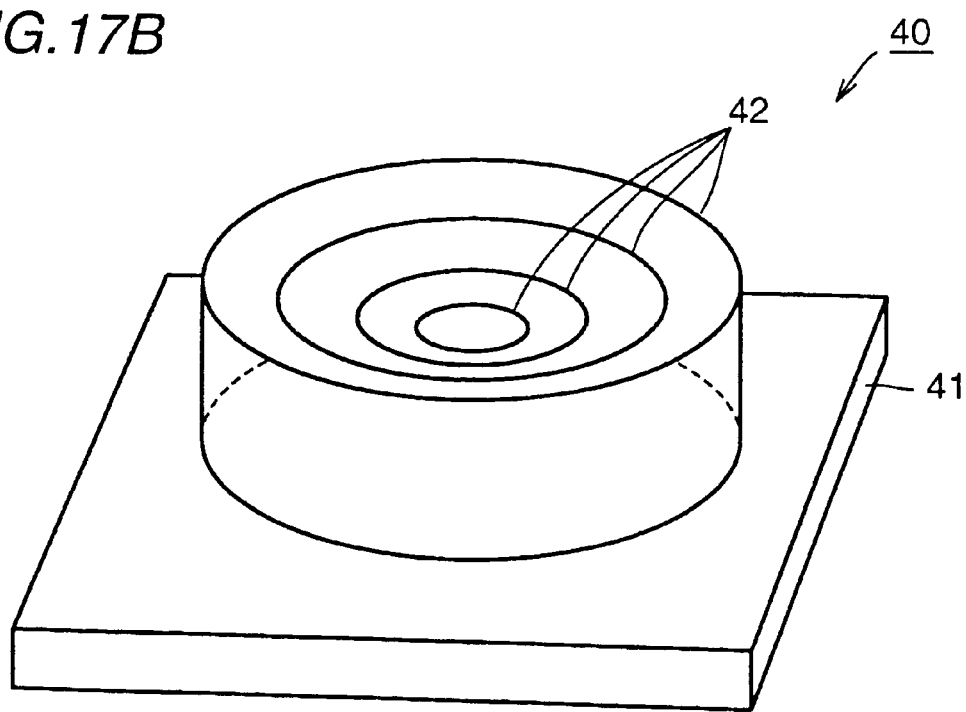

FIGS. 16A and 17B are a cross sectional view and a perspective view, respectively, of a filter for eliminating positive, amplitude field curvature according to a nineteenth embodiment of the present invention. Filter 41 for eliminating positive, amplitude field curvature has transparent substrate 41 and translucent multilayered film 42 formed on a surface of transparent substrate 41. The thickness of each layer of translucent multilayered film 42 is the same as described in the fifteenth embodiment, i.e., $n\times\lambda$.

Figure 25C:
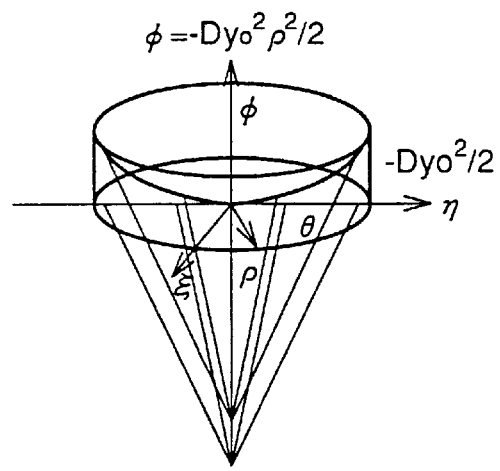

As has been illustrated in FIG. 25C, when a field curvature is converted into a wavefront aberration on a pupil plane, the quantity $\phi$ of shift of wavefront is represented as $\phi=-Dy_0^2\rho^2/2$. Thus, when a dominant amplitude aberration in an exposure optical system is a positive, amplitude field curvature, translucent multilayered film 42 for compensating for the positive, amplitude field curvature has a concentrical, domed shape a cross section of which is represented by a negative quadratic function. By putting this filter 40 for eliminating amplitude aberration onto the pupil plane of the projection optical system, the positive, amplitude field curvature can be eliminated and image quality can be improved.

Twentieth Embodiment

FIGS. 17A and 17B are a cross sectional view and a perspective view, respectively, of a filter for eliminating negative, amplitude field curvature according to a twentieth embodiment of the present invention. Filter 40 for eliminating negative, amplitude field curvature has transparent substrate 41 and translucent multilayered film 42 formed on a surface of transparent substrate 41. The thickness of each layer of translucent multilayered film 42 is the same as described in the fifteenth embodiment, i.e., $n\times\lambda$.

As has been illustrated in FIG. 25C, when a field curvature is converted into a wavefront aberration on a pupil plane, the quantity $\phi$ of a shift of wavefront is represented as $\phi=-Dy_0^2\rho^2/2$. Thus, a dominant amplitude aberration in an exposure optical system is a negative, amplitude field curvature, translucent multilayered film 42 for compensating for the negative, amplitude field curvature has a concentric, mortar-like shape a cross section of which is represented by a positive quadratic function. By putting this filter 40 for eliminating amplitude aberration onto the pupil plane of the projection optical system, the negative, amplitude field curvature can be eliminated and image quality can be improved.

Twenty-first Embodiment

Figure 18A:
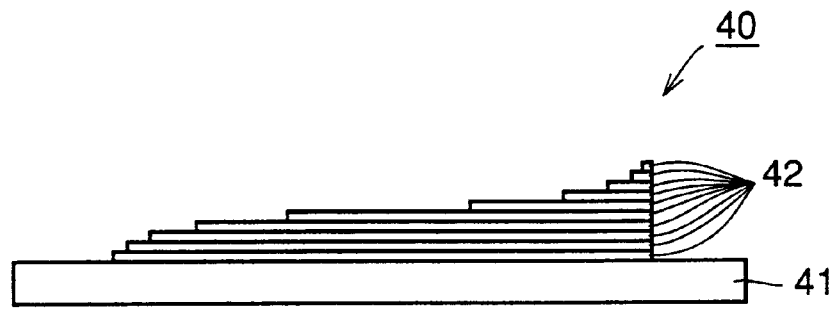
FIGS. 18A and 18B are a cross sectional view and a perspective view, respectively, of an amplitude-aberration eliminating filter which compensates for a distortion amplitude aberration according to a twenty-first embodiment of the present invention.
Figure 18B:
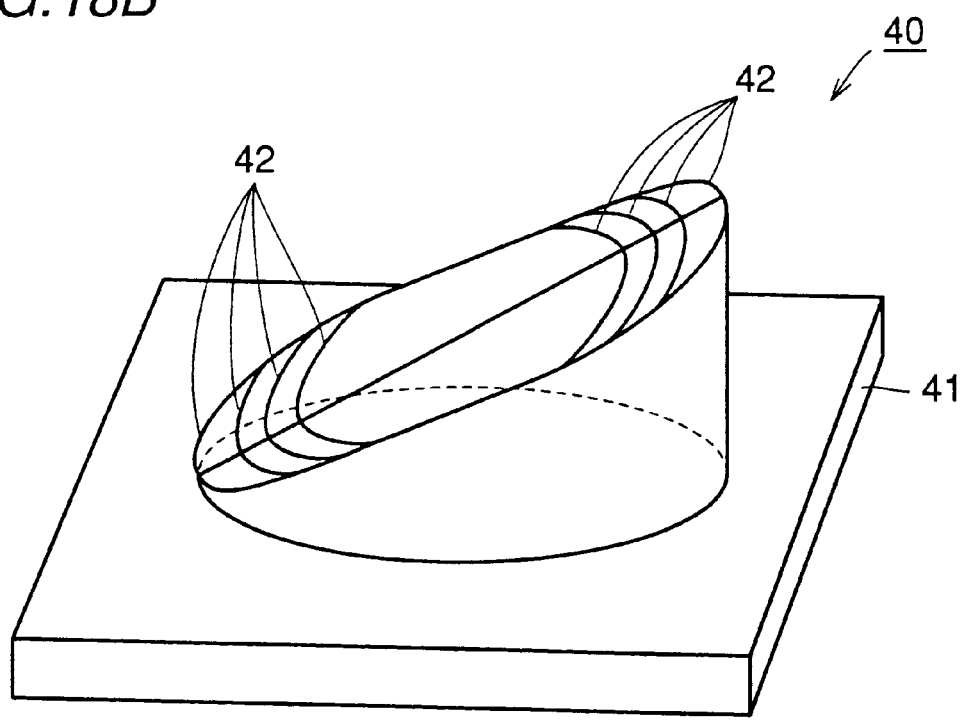

FIGS. 18A and 18B are a cross sectional view and a perspective view, respectively, of a filter for eliminating distortion amplitude aberration according to a twenty-first embodiment of the present invention. Filter 40 for eliminating distortion amplitude aberration has transparent substrate 41 and translucent multilayered film 42 formed on a surface of transparent substrate 41. The thickness of each layer of translucent multilayered film 42 is the same as described in the fifteenth embodiment, i.e., $n\times\lambda$.

Figure 25D:
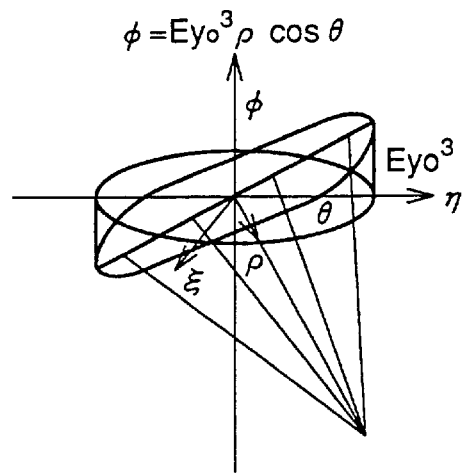

As has been illustrated in FIG. 25D, when a distortion aberration is converted into a wavefront aberration on a pupil plane, the quantity $\phi$ of a shift of wavefront is represented as $\phi=Ey_0^3\rho \cos\theta$. Thus, when a dominant aberration in an exposure optical system is a distortion amplitude aberration, translucent multilayered film 42 for eliminating the distortion amplitude aberration has that plane inclined in one direction a cross section of which is represented by a linear function. By putting this filter 40 for eliminating amplitude aberration onto the pupil plane of the projection optical system, the distortion amplitude aberration can be eliminated and image quality can be improved.

Twenty-second Embodiment

Figure 19A:
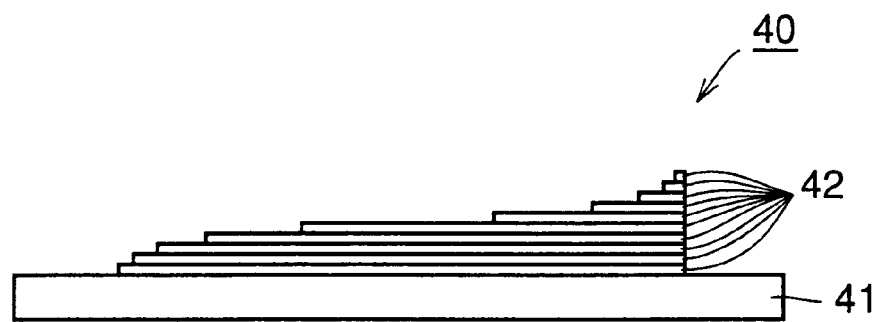
FIGS. 19A and 19B are a cross sectional view and a perspective view, respectively, of an amplitude-aberration eliminating filter which compensates for a coma amplitude aberration according to a twenty-second embodiment of the present invention.
Figure 19B:
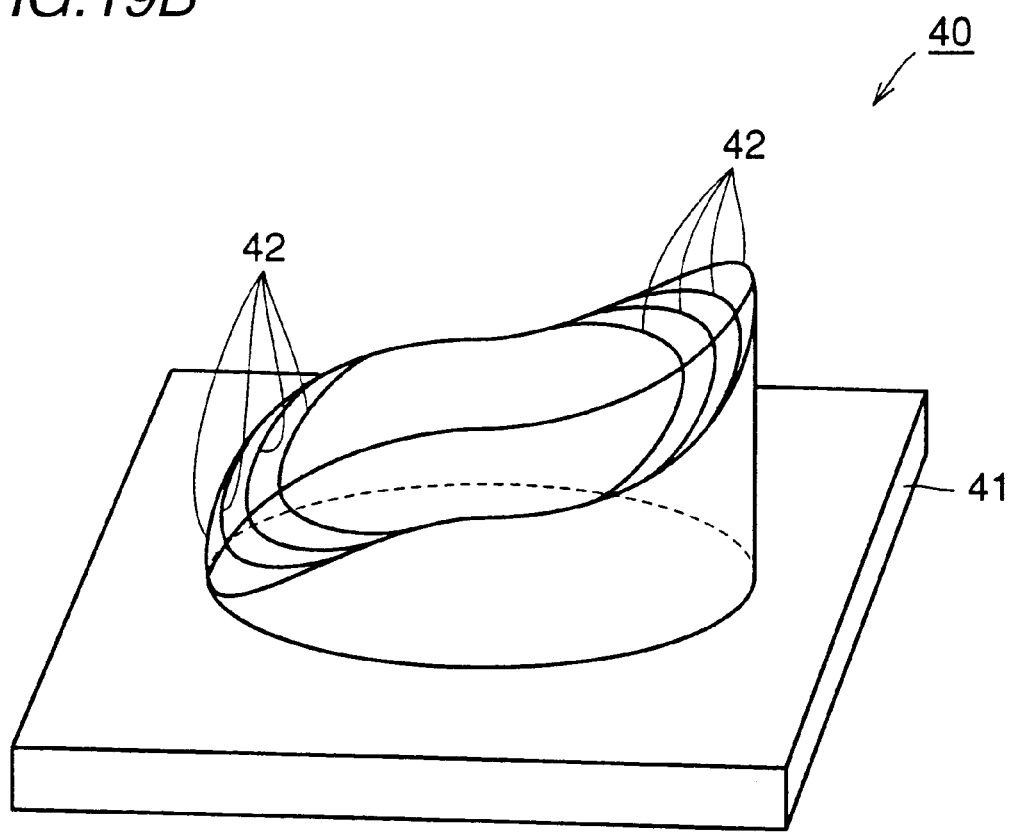
Figure 20A:
FIGS. 20A and 20B are a cross sectional view and a perspective view, respectively, of an amplitude-aberration eliminating filter according to a twenty-third embodiment of the present invention.
Figure 20B:
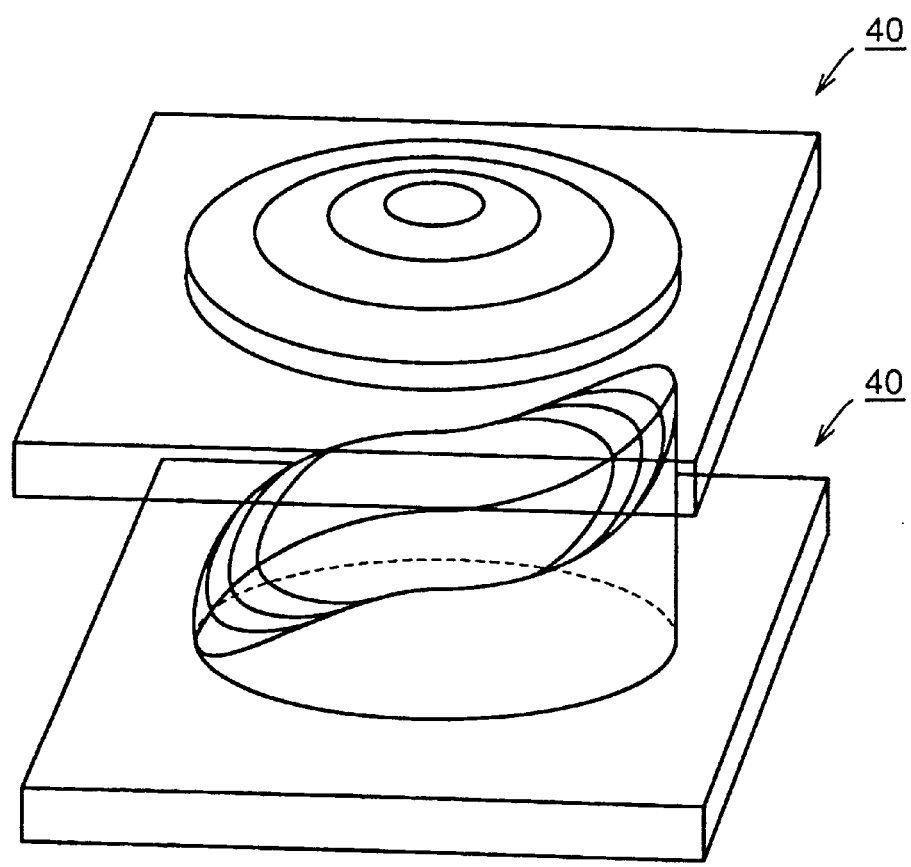

FIGS. 19A and 19B are a cross sectional view and a perspective view, respectively, of a filter for eliminating coma amplitude aberration according to a twenty-second embodiment of the present invention. Filter 40 for eliminating coma amplitude aberration has transparent substrate 41 and translucent multilayered film 42 formed on a surface of transparent substrate 41. The thickness of each layer of translucent multilayered film 42 is the same as described in the fifteenth embodiment, i.e., $n\times\lambda$.

Figure 25E:
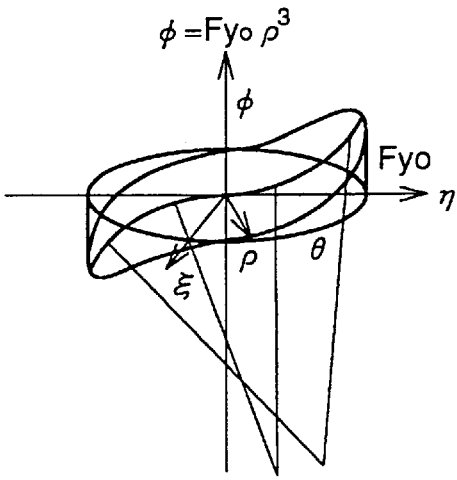

As has been illustrated in FIG. 25E, when a coma aberration is converted into a wavefront aberration on a pupil plane, the quantity $\phi$ of a shift of wavefront is expressed as $\phi=Fy_0\rho_3$. Thus, when a dominant aberration in an exposure optical system is a coma amplitude aberration, translucent multilayered film 42 for compensating for the coma amplitude aberration has that slope inclined in one direction a cross section of which is represented by a cubic function. By putting this filter 40 for eliminating amplitude aberration onto the pupil plane of the projection optical system, the coma amplitude aberration can be eliminated and image quality can be improved.

Twenty-third Embodiment

Figure 16B:
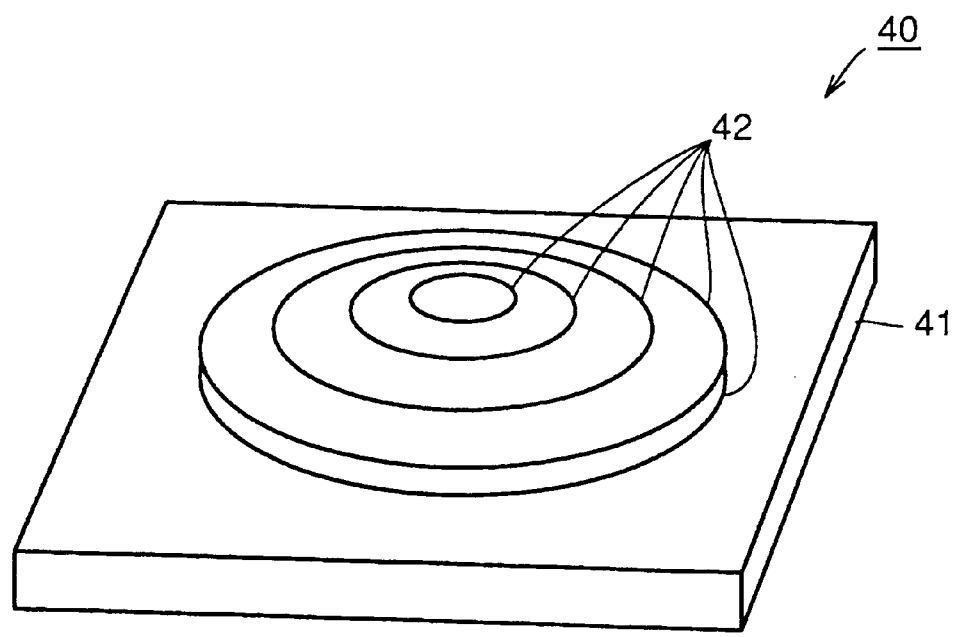

In the case where a plurality of types of aberrations coexist, appropriate combinations of the filters for eliminating amplitude aberration described in the fifteenth to twenty-second embodiments may be used. For example, the amplitude-aberration eliminating filter for compensating for negative, amplitude field curvature according to the nineteenth embodiment (FIG. 16) and the amplitude-aberration eliminating filter for compensating for coma amplitude aberration described in the twenty-second embodiment (FIG. 19) can be combined to simultaneously compensate for positive, amplitude field curvature and coma amplitude aberration. In general, various types of amplitude aberrations coexist in practical optical systems and thus appropriate combinations of the filters for eliminating amplitude aberrations described in the fifteenth to twenty-second embodiments allow complete elimination of various types of amplitude aberrations and thus improve image quality.

Twenty-fourth Embodiment

Figure 21:
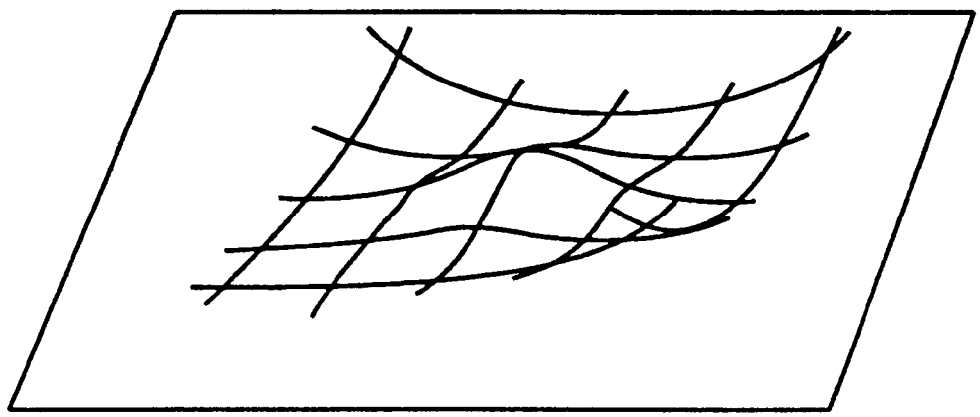
FIG. 21 is a perspective view showing a shift of wavefront when various types of amplitude aberrations are synthesized in a twenty-fourth embodiment of the present invention.
Figure 22:
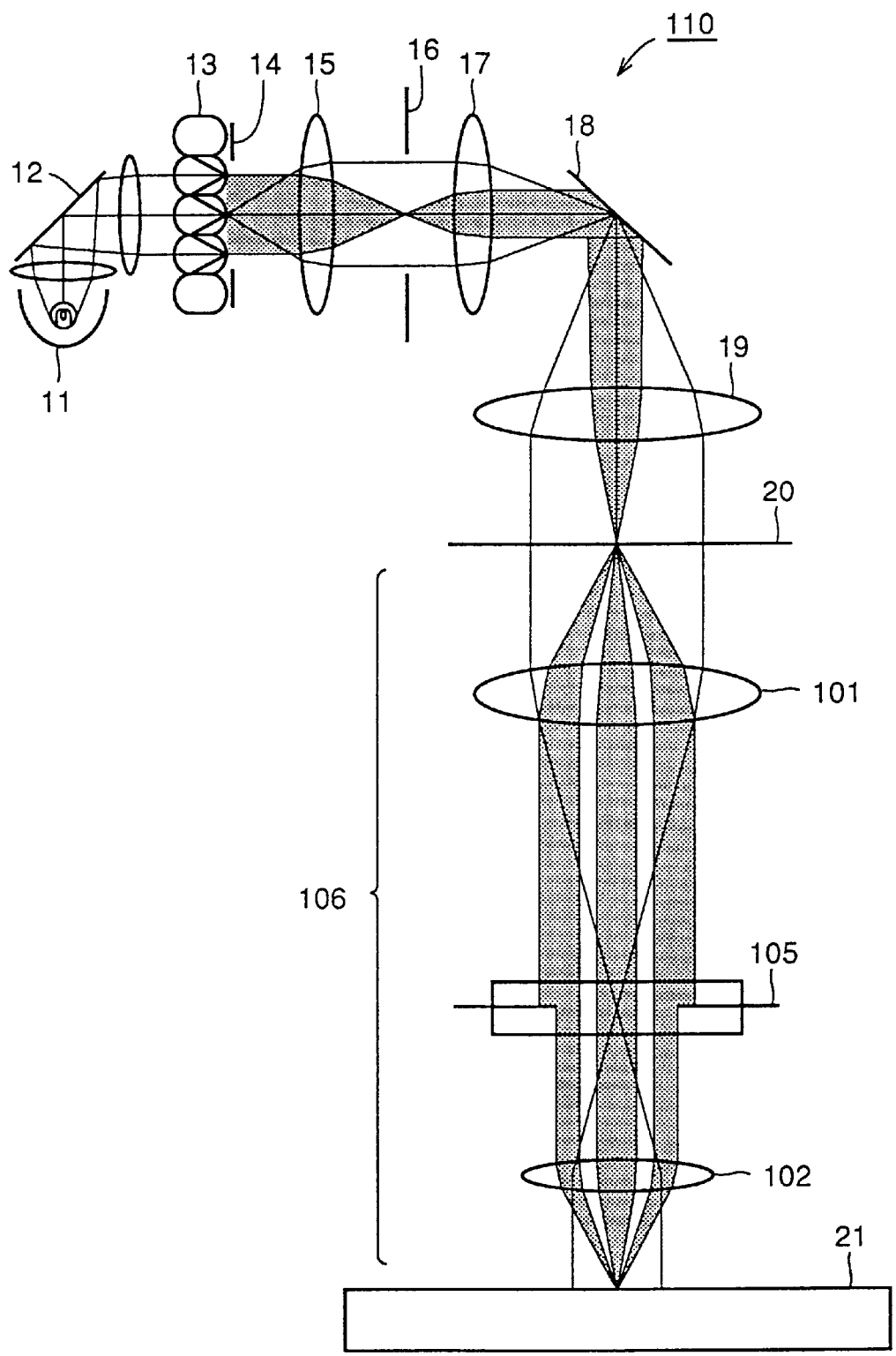
FIG. 22 is a schematic view of a configuration of a conventional projection printing apparatus.
Figure 23:
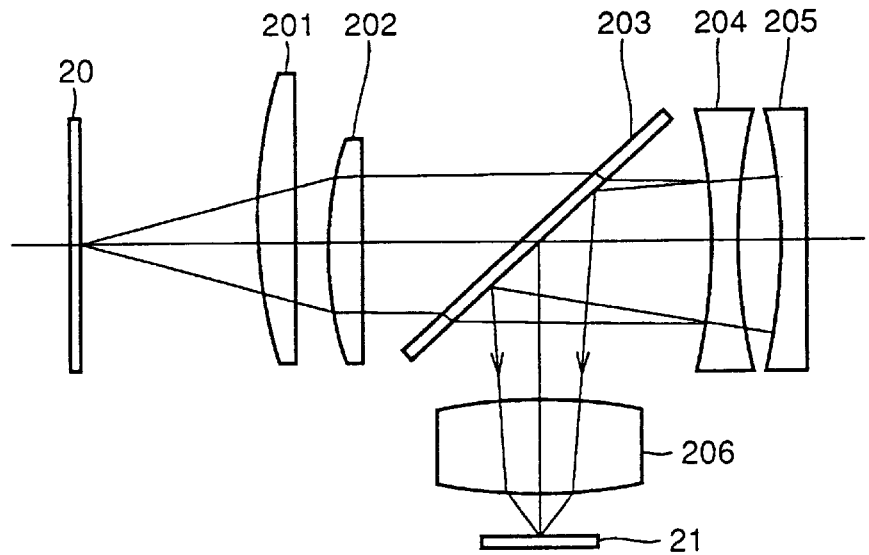
FIG. 23 is a schematic view of a configuration of a conventional projection printing apparatus.
Figure 24:
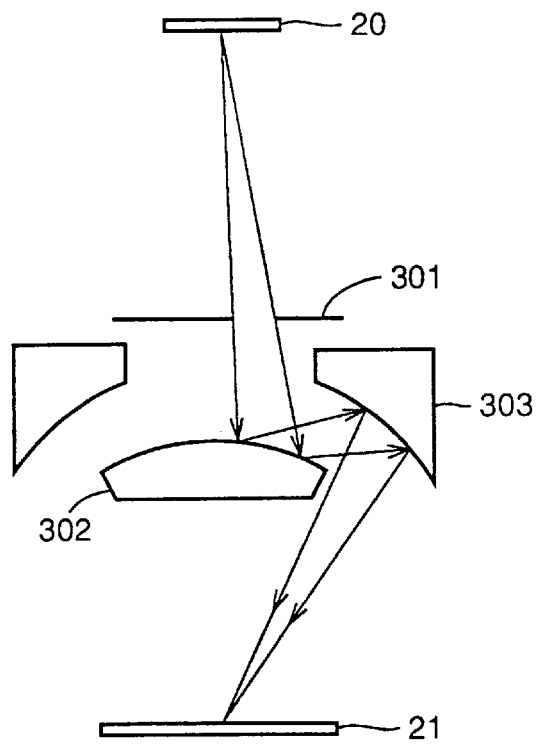
FIG. 24 is a schematic view of a configuration of a conventional projection printing apparatus.

The quantities of the various amplitude aberrations estimated by the methods of estimating the quantity of amplitude aberration according to the tenth to fourteenth embodiments can be synthesized as shown in FIG. 21 so as to manufacture a composite, amplitude-aberration eliminating filter having characteristics which compensate for the synthesized amplitude aberrations. For example, an amplitude-aberration eliminating filter is manufactured by forming on a transparent substrate a translucent multilayered film having that shape in cross section which corresponds to such synthesized amplitude aberrations as shown in FIG. 21.

Introduction of such a composite filter for eliminating amplitude aberrations allows complete elimination of the various types of amplitude aberrations and thus improves image quality.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A projection printing apparatus illuminating a photomask with illumination light from a light source and focusing diffracted light beam from the illuminated said photomask onto an exposure substrate by a projection optical system to project a circuit pattern, wherein
said projection optical system has a first halfmirror, a first concave mirror for reflecting a reflected light beam or a transmitted light beam from said first halfmirror, a second halfmirror provided separately from said first halfmirror, and a second concave mirror for reflecting a reflected light beam or a transmitted light beam from said second halfmirror.

2. The projection printing apparatus according to claim 1, wherein said first and second halfmirrors are arranged in symmetry or similar symmetry with respect to a normal to an optical axis of said diffracted light beam directed from said first halfmirror to said second halfmirror.

3. The projection printing apparatus according to claim 1, wherein:
reflection planes of said first and second halfmirrors are arranged along imaginary lines, respectively, arranged in symmetry with respect to a normal to said optical axis of said diffracted light beam directed from said first halfmirror to said second halfmirror; and
said first and second concave mirrors are arranged such that an arrangement direction of said first concave mirror with respect to said first halfmirror and an arrangement direction of said second concave mirror with respect to said second halfmirror are in symmetry with respect to said normal.

4. The projection printing apparatus according to claim 3, wherein said first and second halfmirrors and said first and second concave mirrors are arranged such that said diffracted light beam from said photomask illuminates said first concave mirror via said first halfmirror, is then reflected from said first concave mirror and then illuminates said second concave mirror via said first and second halfmirrors, and is then reflected from said second concave mirror and then forms an image on said exposed substrate via said second halfmirror.

5. The projection printing apparatus according to claim 4, wherein said first and second halfmirrors and said first and second concave mirrors are arranged such that:
said diffracted light beam from said photomask is transmitted through said first halfmirror and then reflected from said first concave mirror;
said diffracted light beam reflected from said first concave mirror is reflected from said first and second halfmirrors successively and then reflected from said second concave mirror; and
said diffracted light beam reflected from said second concave mirror is transmitted through said second halfmirror and forms an image on said exposed substrate.

6. The projection printing apparatus according to claim 4, wherein said first and second halfmirrors and said first and second concave mirrors are arranged such that:
said diffracted light beam from said photomask is reflected from said first halfmirror and then reflected from said first concave mirror;
said diffracted light beam reflected from said first concave mirror is transmitted through said first and second halfmirrors successively and then reflected from said second concave mirror; and
said diffracted light beam reflected from said second concave mirror is reflected from said second halfmirror and forms an image on said exposed substrate.

7. The projection printing apparatus according to claim 1, further comprising a wavefront-aberration eliminating filter provided at at least one of said first halfmirror, said second halfmirror and a pupil plane positioned between said first and second halfmirrors, for eliminating a wavefront aberration.

8. The projection printing apparatus according to claim 1, further comprising an amplitude-aberration eliminating filter provided at at least one of said first halfmirror, said second halfmirror and a pupil plane positioned between said first and second halfmirrors, for eliminating an amplitude aberration.

9. A mask pattern for estimating an amplitude aberration, comprising
a transparent substrate,
a micropattern selectively formed on said transparent substrate and substantially having a size of a resolution limit, and
a larger pattern selectively formed on said transparent substrate and having a size of no less than five times a wavelength of exposure light, characterized in that
a plurality of sets of each said micropattern and each said larger pattern are arranged on said transparent substrate.

10. A projection printing method comprising the steps of:
illuminating a photomask with illumination light from a light source;
directing a diffracted light beam from said photomask to a first concave mirror via a first halfmirror;
reflecting said diffracted light beam at said first concave mirror;

directing said diffracted light beam reflected from said first concave mirror to a second concave mirror via said first halfmirror and a second halfmirror;

reflecting said diffracted light beam at said second concave mirror; and focusing on an exposed substrate said diffracted light beam reflected from said second concave mirror to form an image on said exposed substrate via said second halfmirror.

11. The projection printing method according to claim 10, wherein said diffracted light beam is transmitted through a wavefront-aberration eliminating filter arranged at at least one of said first halfmirror, said second halfmirror and a pupil plane arranged between said first and second halfmirrors to compensate for a wavefront aberration of said diffracted light beam.

12. The projection printing method according to claim 10, wherein said diffracted light beam is transmitted through an amplitude-aberration eliminating filter arranged at at least one of said first halfmirror, said second halfmirror and a pupil plane arranged between said first and second halfmirrors to compensate for an amplitude aberration of said diffracted light beam.

13. A method of estimating a quantity of an amplitude aberration, comprising the steps of:

illuminating a mask pattern having at least one of a micro-pattern and a larger pattern to produce a mask pattern image;

projecting said mask pattern image on an exposed substrate;

producing a resist pattern on said exposed substrate;

observing said resist pattern;

extracting a variation in at least one of an optical contrast and optimum dose of said resist pattern of said at least one of said micro-pattern and said larger pattern; and estimating a quantity of an amplitude aberration from said extracted variation.

14. The method of estimating a quantity of an amplitude aberration according to claim 13, characterized in that a quantity of an extracted variation in said contrast between said micropattern and said larger pattern is used to estimate a quantity of a spherical amplitude aberration.

15. The method of estimating a quantity of an amplitude aberration according to claim 13, characterized in that a quantity of an extracted variation in said contrast between a longitudinal pattern element and a lateral pattern element of said micropattern and said larger pattern is used to estimate a quantity of an astigmatism amplitude aberration.

16. The method of estimating a quantity of an amplitude aberration according to claim 13, characterized in that a quantity of an extracted variation in said contrast among a plurality of said larger patterns is used to estimate a quantity of an amplitude field curvature.

17. The method of estimating a quantity of an amplitude aberration according to claim 13, characterized in that a quantity of an extracted variation in said optimum dose between said micropattern and said larger pattern is used to estimate a quantity of a coma amplitude aberration.

18. The method of estimating a quantity of an amplitude aberration according to claim 13, characterized in that a quantity of an extracted variation in said optimum dose of said micropattern and said larger pattern depending on an exposed position is used to estimate a distortion amplitude aberration.

19. An amplitude-aberration eliminating filter arranged within a projection optical system for focusing a diffracted light from a photomask onto an exposed substrate, comprising:

a transparent substrate having a main surface; and a translucent multilayered film having a shape capable of eliminating an amplitude aberration formed on the main surface of said transparent substrate; wherein a thickness of each layer configuring said translucent multilayered film is represented by $n \times \lambda$, wherein $\lambda$ represents a wavelength of said diffracted light and n represents an integer.

20. The amplitude-aberration eliminating filter according to claim 19, characterized in that said translucent multilayered film has a concentric, domed shape a cross section of which is represented by a negative quartic function to eliminate a positive, spherical amplitude aberration.

21. The amplitude-aberration eliminating filter according to claim 19, characterized in that said translucent multilayered film has a concentric, mortar-like shape a cross section of which is represented by a positive quartic function to eliminate a negative, spherical amplitude aberration.

22. The amplitude-aberration eliminating filter according to claim 19, characterized in that said translucent multilayered film has that domed shape only in one direction a cross section of which is represented by a negative quadratic function, to eliminate a positive, astigmatism amplitude aberration.

23. The amplitude-aberration eliminating filter according to claim 19, characterized in that said translucent multilayered film has that mortar-like shape only in one direction a cross section of which is represented by a positive quadratic function to eliminate a negative, astigmatism amplitude aberration.

24. The amplitude-aberration eliminating filter according to claim 19, characterized in that said translucent multilayered film has a concentric, domed shape a cross section of which is represented by a negative quadratic function to eliminate a positive, amplitude field curvature.

25. The amplitude-aberration eliminating filter according to claim 19, characterized in that said translucent multilayered film has a concentric, mortar-like shape a cross section of which is represented by a positive quadratic function to eliminate a negative, amplitude field curvature.

26. The amplitude-aberration eliminating filter according to claim 19, characterized in that said translucent multilayered film has that plane inclined in one direction a cross section of which is represented by a linear function to eliminate a distortion amplitude aberration.

27. The amplitude-aberration eliminating filter according to claim 19, characterized in that said translucent multilayered film has that slope inclined in one direction a cross section of which is represented by a cubic function to eliminate a coma amplitude aberration.

28. The amplitude-aberration eliminating filter according to claim 19, characterized in that said translucent multilayered film has a distribution of transmissivity compensating for a distribution of transmissivity obtained by synthesizing distributions of transmissivity resulting from amplitude aberrations detected according to claim 13 and has a transmissivity distribution compensating for the synthesized transmissivity distribution.

* * * * *